(12) United States Patent
Kakutani et al.

(10) Patent No.: US 10,047,202 B2
(45) Date of Patent: Aug. 14, 2018

(54) RESIN-CONTAINING SHEET, AND STRUCTURE AND WIRING BOARD USING SAME

(71) Applicant: ASAHI KASEI KABUSHIKI KAISHA, Tokyo (JP)

(72) Inventors: Takenori Kakutani, Saitama (JP); Takao Miwa, Saitama (JP); Hirofumi Ono, Tokyo (JP); Yamato Saito, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/523,504

(22) PCT Filed: Oct. 28, 2015

(86) PCT No.: PCT/JP2015/080448
§ 371 (c)(1),
(2) Date: May 1, 2017

(87) PCT Pub. No.: WO2016/072334
PCT Pub. Date: May 12, 2016

(65) Prior Publication Data
US 2017/0313831 A1    Nov. 2, 2017

(30) Foreign Application Priority Data

Nov. 4, 2014    (JP) .................................. 2014-224603

(51) Int. Cl.
*C08J 5/06*      (2006.01)
*B32B 27/06*     (2006.01)
(Continued)

(52) U.S. Cl.
CPC ...................................... *C08J 5/06* (2013.01); *B32B 5/26* (2013.01); *B32B 27/06* (2013.01); *B32B 27/285* (2013.01);
(Continued)

(58) Field of Classification Search
None
See application file for complete search history.

(56) References Cited

U.S. PATENT DOCUMENTS 4,942,364 A * 7/1990 Nishijima ............ G01N 27/121
                                                     324/694
5,888,916 A * 3/1999 Tadokoro ................. D04H 1/54
                                                    156/308.2

(Continued)

FOREIGN PATENT DOCUMENTS

CA      2879447      *  1/2014
EP      3 199 701 A1    8/2017
(Continued)

OTHER PUBLICATIONS

International Search Report issued by the Japanese Patent Office in International Application No. PCT/JP2015/080448, dated Feb. 2, 2016 (2 pages).

(Continued)

*Primary Examiner* — Tahseen N Khan
(74) *Attorney, Agent, or Firm* — Finnegan, Henderson, Farabow, Garrett & Dunner, LLP

(57) ABSTRACT

Provided are: a resin-containing sheet in which not only the mechanical strength of a cellulose nanofiber nonwoven fabric but also the flexural resistance of a substrate are improved; and a structure and a wiring board which include the same. The resin-containing sheet includes: a specific cellulose nanofiber nonwoven fabric (11); a fixing agent (2) which fixes together fibers (1) in the cellulose nanofiber (Continued)

nonwoven fabric (11); and a resin (3) which is in contact with the cellulose nanofiber nonwoven fabric (11) and the fixing agent (2), wherein the storage modulus of the fixing agent (2) is higher than that of the resin (3). The structure is obtained by tightly adhering the resin-containing sheet to a substrate. The wiring board includes this structure.

6 Claims, 1 Drawing Sheet

(51) Int. Cl.
    *B32B 27/28*     (2006.01)
    *C08J 5/24*     (2006.01)
    *B32B 5/26*     (2006.01)
    *B32B 27/38*     (2006.01)
    *B32B 27/32*     (2006.01)
    *H05K 1/03*     (2006.01)
    *C08J 5/00*     (2006.01)

(52) U.S. Cl.
    CPC .............. *B32B 27/32* (2013.01); *B32B 27/38* (2013.01); *C08J 5/005* (2013.01); *C08J 5/24* (2013.01); *H05K 1/038* (2013.01); *H05K 1/0366* (2013.01); *B32B 2262/062* (2013.01); *B32B 2457/08* (2013.01); *C08J 2301/02* (2013.01); *C08J 2363/00* (2013.01); *C08J 2379/08* (2013.01); *H05K 2201/0195* (2013.01)

(56) References Cited

U.S. PATENT DOCUMENTS

| | | | | |
|---|---|---|---|---|
| 2004/0224623 | A1* | 11/2004 | Nishiyama | .............. B24B 37/22 451/533 |
| 2007/0207692 | A1* | 9/2007 | Ono | ....................... B01D 39/18 442/327 |
| 2011/0021671 | A1 | 1/2011 | Kuga et al. | |
| 2013/0264007 | A1 | 10/2013 | Noishiki et al. | |
| 2015/0167249 | A1* | 6/2015 | Ono | ....................... B32B 29/02 162/130 |
| 2016/0177512 | A1* | 6/2016 | Kawahara | ............... B32B 23/08 435/289.1 |

FOREIGN PATENT DOCUMENTS

| | | |
|---|---|---|
| JP | 9-307203 | 11/1997 |
| JP | 10-37054 | 2/1998 |
| JP | 2004-168943 | 6/2004 |
| JP | 2006-35647 | 2/2006 |
| JP | 2006-179716 | 7/2006 |
| JP | 2006-316253 | 11/2006 |
| JP | 2008-88280 | 4/2008 |
| JP | 2008-127540 | 6/2008 |
| JP | 2008-242154 | 10/2008 |
| JP | 2009-96167 | 5/2009 |
| JP | 2010-95557 | 4/2010 |
| JP | 2012-36529 | 2/2012 |
| WO | WO 2012/090908 A1 | 7/2012 |
| WO | WO 2013/022025 A1 | 2/2013 |
| WO | WO 2014/175315 A1 | 10/2014 |

OTHER PUBLICATIONS

Ansari, Farhan et al., "Cellulose Nanofiber Network for Moisture Stable, Strong and Ductile as Biocomposites and Increased Epoxy Curing Rate," Composites: Part A 63 (2014) 35-44.
Supplementary European Search Report for corresponding EP Application No. 15857169.5 dated Oct. 30, 2017.

\* cited by examiner

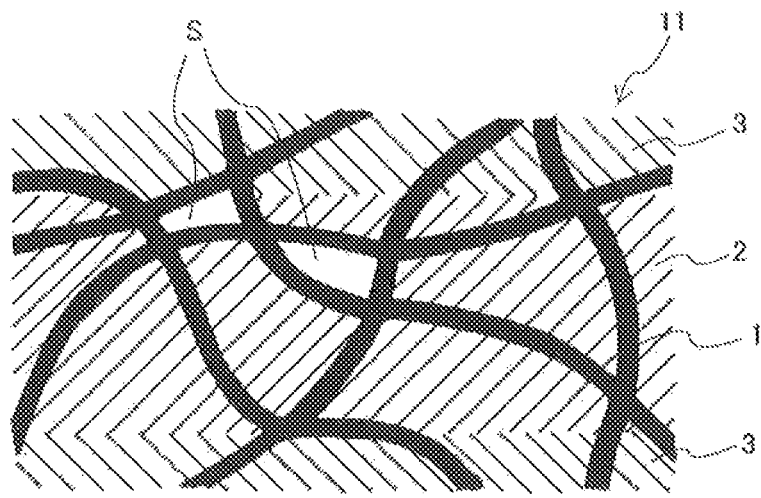

RESIN-CONTAINING SHEET, AND STRUCTURE AND WIRING BOARD USING SAME

TECHNICAL FIELD

The present invention relates to: a resin-containing sheet which has excellent mechanical strength, elastic modulus and flexural resistance and is suitable for wiring boards and the like of electronic devices; and a structure and a wiring board which comprise the same.

BACKGROUND ART

Generally, as wiring boards for electronic devices, those that are produced by tightly adhering a prepreg (a resin insulating layer in a semi-cured state), which is obtained by impregnating a resin such as epoxy into a base material composed of glass fibers, aramid fibers or the like, to a metal foil of copper or the like and then forming a circuit thereon by an etching method. On such wiring boards, a solder resist is arranged for the purpose of inhibiting bleeding of solder at the time of component mounting. Wiring boards are desired to have high strength (high elastic modulus) for improvement of mountability, and their constituent members, which are prepregs and solder resists, are also intended to have a high elastic modulus in the same manner. Further, flexible wiring boards are used in electronic devices, and such flexible wiring boards are demanded to be multilayered in accordance with the need for densification and thickness reduction. Bonding sheets and cover lays are used as multilayering materials of conventional flexible wiring boards, and flexural resistance is demanded in wiring boards.

As prior art relating to a wiring board Material, for example, Patent Document 1 describes a prepreg in which, in order to attain both functions of insulation reliability and relaxation of the stress with wiring, resin layers having different strengths (elastic moduli) are arranged on each side of a core layer. In addition, Patent Document 2 describes a prepreg having a prescribed elastic modulus. This technology is aimed at temporarily fixing a prepreg sheet with a circuit board and controls the elastic modulus using a composition.

Patent Document 3 discloses a technology of using two resin compositions in a prepreg. In this prepreg, the two resin compositions are unevenly distributed in such a manner that the elastic modulus increases toward the surface side. Further, Patent Document 4 discloses a technology of arranging an adhesive layer on the surface of a prepreg for the purpose of improving the adhesion between the prepreg and a metal foil. Moreover, Patent Document 5 discloses a wiring board comprising a thin glass plate and a composite material of cellulose nanofibers and a resin.

RELATED ART DOCUMENTS

Patent Documents

Patent Document 1: Japanese Unexamined Patent Application Publication No. 2008-088280
Patent Document 2: Japanese Unexamined Patent Application Publication No. 2006-179716
Patent Document 3: Japanese Unexamined Patent Application Publication No. 2010-095557
Patent Document 4: Japanese Unexamined Patent Application Publication No. 2004-168943
Patent. Document 5: Japanese Unexamined Patent Application Publication No. 2008-242154

SUMMARY OF THE INVENTION

Problems to be Solved by the Invention

However, the above-described conventional prepregs and wiring boards do not have sufficient mechanical strength and flexural resistance.

Therefore, an object of the present invention is to provide a resin-containing sheet in which not only the mechanical strength but also the flexural resistance are improved, as well as a structure and a wiring board which comprise the resin-containing sheet.

Means for Solving the Problems

The present inventors conducted intensive studies to solve the above-described problems and consequently discovered the followings.

That is, in a nonwoven fabric composed of fine fibers such as a cellulose nanofiber nonwoven fabric, the fibers form aggregates through entanglement and interaction. Thus, when a tension is applied to the fiber aggregates in one direction, the fibers are separated from each other due to slippage at their contact points, and this causes the aggregates to be disintegrated, eventually resulting in breakage of the fabric.

As described above, since a resin-containing sheet, such as a glass cloth or a prepreg composed of aramid fibers and a resin, is used in a wiring board, in order to ensure the strength of the wiring board, it is critical to inhibit such slippage of fibers in fiber aggregates. Meanwhile, as described above, the resin-containing sheet is also required to have flexural resistance as demanded for flexible wiring boards.

As a result of the intensive studies, the present inventors discovered that a good balance of mechanical strength and flexural resistance can be attained by adopting the following constitution.

That is, the resin-containing sheet of the present invention comprises:
a cellulose nanofiber nonwoven fabric which is constituted by a single layer or not more than three plural layers comprising at least one cellulose fine fiber layer that contains regenerated cellulose fine fibers in an amount of not less than 70% by mass, the cellulose nanofiber nonwoven fabric satisfying all of the following requirements (1) to (3):
 (1) fibers constituting the cellulose fine fiber layer have a specific surface area-equivalent fiber diameter of 0.20 µm to 1.0 µm,
 (2) the air permeation resistance is 1 s/100 ml to 40 s/100 ml, and
 (3) the film thickness is 8 µm to 22 µm;
a fixing agent which fixes together the fibers in the cellulose nanofiber nonwoven fabric; and
a resin which is in contact with the cellulose nanofiber nonwoven fabric and the fixing agent,
wherein the storage modulus of the fixing agent is higher than that of the resin.

In the present invention, it is preferred that the glass transition temperature of the fixing agent be higher than the glass transition temperature or die softening temperature of the resin. The resin-containing sheet of the present invention can be obtained by fixing together the fibers of the cellulose nanofiber nonwoven fabric using a fixing agent composition and subsequently impregnating the thus fixed cellulose nanofiber nonwoven fabric with a resin composition. In this case, the fixing agent composition preferably has a viscosity of 1 Pa·s or less.

The structure of the present invention is characterized in that it is obtained by tightly adhering the resin-containing sheet of the present invention to a substrate.

Further, the wiring board of the present invention is characterized by comprising the structure of the present invention.

Effects of the Invention

According to the present invention, a resin-containing sheet in which not only the mechanical strength but also the flexural resistance are improved can be obtained. That is, in the present invention, by using regenerated cellulose fine fibers as a fiber component to constitute a cellulose nanofiber nonwoven fabric having specific physical properties and controlling the storage modulus of a fixing agent that fixes together the fibers in this cellulose nanofiber nonwoven fabric to be higher than the storage modulus of a resin that is in contact with both the cellulose nanofiber nonwoven fabric and the fixing agent, the conditions of a material for obtaining a resin-containing sheet in which not only the strength and the elastic modulus are increased but also the flexural resistance is improved were discovered. An increase in strength is demanded for those resin insulating materials used in wiring boards; however, for example, the use of a high-elastic-modulus material such as epoxy deteriorates the flexural resistance. The present invention solves this problem of flexural resistance while realizing an increase in elastic modulus.

BRIEF DESCRIPTION OF THE DRAWING

FIG. 1 is a drawing that illustrates a model of the structure of the resin-containing sheet of the present invention.

MODE FOR CARRYING OUT THE INVENTION

Embodiments of the present invention will now be described in detail referring to the drawing.

FIG. 1 is a drawing that illustrates the structure of the resin-containing sheet of the present invention. The resin containing sheet of the present invention is a sheet-form article which is mainly constituted by a fiber component and a resin component and, as shown in FIG. 1, the resin-containing sheet of the present invention comprises: a cellulose nanofiber nonwoven fabric 11; a fixing agent 2, which fixes together fibers 1 in the cellulose nanofiber nonwoven fabric 11; and a resin 3, which is in contact with both the cellulose nanofiber nonwoven fabric 11 and the fixing agent 2. In FIG. 1, a symbol S indicates a space inside the cellulose nanofiber nonwoven fabric 11 that is impregnated with neither the fixing agent 2 nor the resin 3. In the resin-containing sheet of the present invention, it can be said that the fibers 1 constituting the cellulose nanofiber nonwoven fabric 11, the fixing agent 2 and the resin 3 together form a single layer as a whole. In the resin-containing sheet of the present invention, it is important that the storage modulus of the fixing agent 2 which fixes together the fibers 1 is higher than that of the resin 3 at any one temperature.

That is, as a result of intensive studies, the present inventors discovered that the components contained in the resin-containing sheet have two roles, one of which is a role as a fixing agent for inhibiting slippage of the fibers and thereby increasing the strength and the elastic modulus of the resin-containing sheet and the other of which is a role in improving the flexural resistance. As a result of further studies conducted on the basis of such finding, the present inventors also discovered that the fixing agent is responsible for ensuring high strength as a role of the resin component contained in the resin-containing sheet and that, by defining the relationship of the fixing agent and the resin in terms of storage modulus and glass transition temperature and incorporating the fixing agent, the resin and the cellulose nanofiber nonwoven fabric for the purpose of ensuring flexural resistance, both of these performances can be secured in a favorable manner. Such a technology of assigning a resin component with two separate roles and thereby achieving both a high elastic modulus and good flexural resistance in this manner has not been previously known.

Conceptually describing the present invention, by fixing together the fibers contained in the cellulose nanofiber nonwoven fabric at their contact points using the fixing agent, slippage of the fibers at the contact points does not occur even when a tension is applied thereto in one direction, and this allows the cellulose nanofiber nonwoven fabric to have a high strength and a high elastic modulus. Further, by impregnating the resin in contact with both the cellulose nanofiber nonwoven fabric and the fixing agent, the resulting resin-containing sheet can attain good flexural resistance. Therefore, according to the resin-containing sheet of the present invention, flexural resistance can also be ensured while a high elastic modulus, which is a required performance, is secured by the fixing agent, and this enables to obtain a resin-containing sheet having both high strength and good flexural resistance, which could not be obtained by the mere use of a high-elastic-modulus material such as epoxy.

[Cellulose Nanofiber Nonwoven Fabric]

The cellulose nanofiber nonwoven fabric used in the resin-containing, sheet of the present invention is constituted by a single layer or not more than three plural layers comprising at least one cellulose fine fiber layer that contains regenerated cellulose fine fibers in an amount of not less than 70% by mass, preferably not less than 75% by mass. A regenerated fine cellulose fiber amount of less than 70% by mass is not preferred from the standpoint of impregnation with the resin.

First, the regenerated cellulose fine fibers constituting the cellulose nanofiber nonwoven fabric will be described. In the present invention, the term "regenerated cellulose" refers to β-1,4-linked glucan (glucose polymer), which is a substance obtained by dissolution or crystal swelling (mercerization) and subsequent regeneration of natural cellulose and has such a molecular sequence that gives a crystal diffraction pattern (cellulose II-type crystal) showing a diffraction angle corresponding to a lattice spacing of 0.73 nm, 0.44 nm or 0.40 nm as a peak in particle beam diffraction, meaning, for example, a regenerated cellulose fiber such as rayon, cupra tencel. Thereamong, from the standpoint of the ease of refining, it is preferred to use refined fibers that are obtained by using cupra or tencel having a high molecular orientation in the fiber axial direction as a raw material.

The fibers constituting the cellulose fine fiber layer contained in the cellulose nanofiber nonwoven fabric is required to have a specific surface area-equivalent fiber diameter of 1.0 µm or less, preferably 0.7 µm or less, most preferably 0.5 µm or less. The specific surface area-equivalent fiber diameter will now be described. First, the specific surface area was evaluated by the BET method based on nitrogen adsorption and, in accordance with a cylinder model which assumes that, with respect to this specific surface area, the fibers constituting the resin-containing sheet is in an ideal state with virtually no occurrence of fusion between the fibers at all and that the surface is constituted by fibers in the form of cylinders whose cellulose density is d (g/cm$^3$) and value of L/D (L=fiber length and D=fiber diameter (both in μm)) is infinity, the following equation pertaining to the specific surface area and the fiber diameter was derived:

$$\text{Specific surface area}=4/(dD)(m^2/g)$$

A numerical value, which is obtained by substituting the specific surface area determined by the BET method into the above equation along with 1.50 g/cm$^3$ as the value of the cellulose density (d) and then converting the equation in terms of the fiber diameter (D), is defined as the specific surface area-equivalent fiber diameter. It is noted here that the measurement of the specific surface area by the BET method was carried out by measuring the amount of adsorbed nitrogen gas at the boiling point of liquid nitrogen for a sample of about 0.2 g using a specific surface area/pore distribution analyzer (manufactured by Beckman Coulter, Inc.) in accordance with a program of the analyzer, and subsequently calculating the specific surface area.

By selecting the specific surface area-equivalent fiber diameter of the fibers constituting the cellulose fine fiber layer to be in the above-described range, a uniform thickness distribution can be imparted to the resin-containing sheet of the present invention. When the fibers constituting the cellulose fine fiber layer have a specific surface area-equivalent fiber diameter of greater than 1.0 μm, since the fibers are excessively thick, the distribution of microporous structures formed by the fine fibers is increased, that is, large-sized pores are scatterringly distributed, so that a thin resin-containing sheet having excellent uniformity cannot be obtained.

Meanwhile, the specific surface area-equivalent fiber diameter of the fibers constituting the cellulose fine fiber layer is required to be not less than 0.20 μm, preferably not less than 0.25 μm. When the specific surface area-equivalent fiber diameter of the fibers constituting the cellulose fine fiber layer is less than 0.20 μm, the excessively thin fibers makes the pore size small, and this deteriorates the resin impregnation property.

Further, the maximum fiber thickness of the regenerated cellulose fine fibers is preferably 3 μm or less, more preferably 2.5 μm or less, most preferably 2 μm or less. The expression "the maximum fiber thickness is 3 μm or less" used herein means that absolutely no fiber of greater than 3 μm in diameter is observed in an image of cellulose nonwoven fabric measured under the below-described conditions using a scanning electron microscope (SEM). When the fiber diameter is measured to be 3 μm or less for all of entangled fibers that are included in a surface SEM image of the cellulose nanofiber nonwoven fabric taken at a magnification equivalent to ×10,000 and, similarly, no fiber of greater than 3 μm in diameter can be observed for a total of at least 100 fibers in an SEM image taken under the same conditions for an arbitrary portion of the surface of the cellulose fine fiber layer, it is defined that the maximum fiber diameter is 3 μm or less. However, when it is clearly confirmed that several fine fibers are bundled together to have a diameter of greater than 3 μm, such fibers are not deemed to have a fiber diameter of greater than 3 μm. By controlling the maximum fiber thickness of the regenerated cellulose fine fibers to be 3 μm or less, the uniformity of pore size and the like can be easily secured for the production of a thin resin-containing sheet as defined in the present invention, which is preferred.

The cellulose nanofiber nonwoven fabric is required to have an air permeation resistance in a range of 1 s/100 ml to 40 s/100 ml, preferably in a range of 6 s/100 ml to 35 s/100 ml. The air permeation resistance means a numerical value that is measured based on the Gurley method described in JIS P8117. It is difficult to produce a pinhole-free and uniform sheet constituted by fine fibers as a sheet whose air permeation resistance is less than 1 s/100 ml and, therefore, when the air permeation resistance is less than 1 s/100 ml, the resin-containing sheet does not express its functions. Meanwhile, when the air permeation resistance is greater than 4 s/100 ml, since the resin impregnation property is deteriorated due to a notable decrease in the porosity of the cellulose nanofiber nonwoven fabric or an excessively small pore size, such a cellulose nanofiber nonwoven fabric is not preferred as the one used in the resin-containing sheet of the present invention.

The cellulose nanofiber nonwoven fabric can be obtained by processing regenerated cellulose fine fibers into the form of a sheet; however, because of the constraints on the processing and the functions, the cellulose nanofiber nonwoven fabric is required to have a film thickness of 8 μm to 22 μm. As for the measurement of the film thickness, using a surface contact-type film thickness meter such as a film thickness analyzer manufactured by Mitutoyo Corporation (Model ID-C112XB), the film thickness is measured at 5 various positions on a 10.0 cm×10.0 cm square section cut out from the subject resin-containing sheet, and the average of the measured values is defined as the film thickness T (μm). Further, from the film thickness T (μm) and weight W (g) of the 10.0 cm×10.0 cm square section cut out for the measurement of the film thickness, the film basis weight W0 (g/m$^2$) can be calculated using the following equation:

$$W0=100\times W$$

The cellulose nanofiber nonwoven fabric has a film thickness of preferably 9 μm to 20 μm, most preferably 9 μm to 18 μm. By controlling the film thickness in this range, a resin-containing sheet which shows extremely good electrical characteristics (functions) such as a low internal resistance as well as extremely good ease of handling in the assembly of a device by winding of the resin-containing sheet can be obtained. A thickness of less than 8 μm is inappropriate since it makes the handling of the resin-containing sheet in the device assembly process difficult and causes such problems as the occurrence of a short circuit associated with deterioration over time and deterioration of the long-term stability. Further, a thickness of greater than 22 μm is not preferred from the standpoints of size reduction and the like.

The cellulose fine fiber layer used in the cellulose nanofiber nonwoven fabric has a basis weight of preferably 4 g/m$^2$ to 13 g/m$^2$, more preferably 5 g/m$^2$ to 12 g/m$^2$. A basis weight of not less than 4 g/m$^2$ leads to good ease of handling in the processes of assembling the fabric into various devices and is also preferred from the standpoint of the long-term stability. When the basis weight is 13 g/m$^2$ or less, a reduction in film thickness can be achieved, so that desired effects of size reduction and the like are attained as a resin-containing sheet.

The cellulose fine fiber layer, which is used in the cellulose nanofiber nonwoven fabric and contains regenerated cellulose fine fibers in an amount of not less than 70% by mass, may further contain natural cellulose fine fibers in an amount of less than 30% by mass in addition to the regenerated cellulose fine fibers. By using the natural cellulose fine fibers, not only fine cellulose fibers of less than 0.20 µm in fiber diameter can be relatively easily obtained because of the fineness of the microfibrils that are the structural units of the fibers, but also the strength of the cellulose nanofiber nonwoven fabric can be increased by the coexistence of even finer natural cellulose fibers having a high fiber length to fiber diameter ratio. By incorporating such natural cellulose fine fibers in an amount of less than 30% by mass, the strength of the cellulose fine fiber layer is increased, and a cellulose nanofiber nonwoven fabric having extremely good ease of handling in the assembly of a device can be obtained. The amount of the natural cellulose fine fibers is more preferably less than 20% by mass.

The maximum fiber thickness of the natural cellulose fine fibers that are contained in the cellulose fine fiber layer used in the cellulose nanofiber nonwoven fabric is preferably 2 µm or less. By controlling the maximum fiber diameter to be 2 µm or less, a reduction in film thickness can be favorably achieved by utilizing the high uniformity based on the microporous structures formed by the fine fibers.

Examples of the natural cellulose fine fibers having a maximum fiber diameter of 2 µm or less include wood pulps obtained from broad-leaved trees and coniferous trees; purified linter, and purified pulps and the like obtained from various plant species (e.g., bamboo, hemp fibers, bagasse, kenaf and linter), which are subjected to a high-degree refining treatment; and natural cellulose fine fibers which are never-dry aggregates of fine fibers, such as bacterial cellulose (BC) produced by cellulose-producing microbes (bacteria).

Moreover, the cellulose fine fiber layer, which is used in the cellulose nanofiber nonwoven fabric and contains regenerated cellulose fine fibers in an amount of not less than 70% by mass, may further contain fine fibers composed of an organic polymer other than cellulose in an amount of less than 30% by mass in addition to the regenerated cellulose fine fibers. The amount of such fine fibers is more preferably 25% by mass or less. As the organic polymer, any organic polymer may be used as long as fine fibers can be produced therefrom, and examples thereof include, but not limited to: aromatic or aliphatic polyesters, nylons, polyacrylonitriles, cellulose acetate, polyurethanes, polyethylenes, polypropylenes, polyketones, aromatic polyamides, polyimides, and natural organic polymers other than cellulose, such as silk and wool. Examples of fine fibers composed of such organic polymers include, but not limited to: fine fibers obtained by highly fibrillating or refining organic fibers by beating or a refining treatment using a high-pressure homogenizer or the like; fine fibers obtained by an electrospinning method using various polymers as a raw material; and fine fibers obtained by a melt-blowing method using various polymers as a raw material. Thereamong, particularly, TIARA (registered trademark, manufactured by Daicel Corporation), which is a microfibrillated aramid obtained by refining aramid fibers (wholly aromatic polyamide) using a high-pressure homogenizer, can be preferably used as the above-described fine fibers since it not only has an average fiber diameter of 0.2 to 0.3 µm and an average fiber length of 500 to 600 µm and but also exhibits a high heat resistance and high chemical stability.

[Method of Producing Cellulose Nanofiber Nonwoven Fabric]

Next, a method of producing cellulose fine fibers will be described. It is preferred that cellulose fibers be refined through a pretreatment step, a beating treatment step and a refining step, along with regenerated cellulose fibers and natural cellulose fibers. Particularly, in the refining of regenerated cellulose fibers, the pretreatment step can be carried out by a step of washing the fibers with water for removal of oil agent with the use of a surfactant depending on the case and, in the pretreatment step of natural cellulose fibers, it is effective to subject the raw material pulp to, for example, an autoclave treatment, an enzyme treatment or a combination thereof with the pulp being immersed in water at a temperature of 100 to 150° C. and thereby maintain the raw material pulp in a state of being easily refillable in the subsequent steps. In the pretreatment step, depending on the case, it is also effective to perform an autoclave treatment with an addition of an inorganic acid (e.g., hydrochloric acid, sulfuric acid, phosphoric acid or boric acid) or an organic acid (e.g., acetic acid or citric acid) at a concentration of 1% by mass or less. These pretreatments may be very effective for improving the heat resistance of the resulting cellulose nanofiber nonwoven fabric since they not only reduce the load of the refining treatment, but also has an effect of causing impurities existing on the surface and gaps of microfibrils constituting the cellulose fibers, such as lignin and hemicellulose, to be discharged into an aqueous phase and thereby improving the β-cellulose purity of the resulting refined fibers.

With regard to the beating treatment step and its subsequent steps, cellulose fine fibers are produced as follows along with regenerated cellulose fibers and natural cellulose fibers. In the beating treatment step, the raw material pulp is dispersed in water to a solid concentration of 0.5% by mass to 4% by mass, preferably 0.8% by mass to 3% by mass, more preferably 1.0% by mass to 2.5% by, mass, and fibrillation is highly facilitated using a beating machine such as a beater or a disc refiner (double-disc refiner). In the case of using a disc refiner, since the beating (fibrillation) is allowed to proceed to an extremely high degree by performing the treatment with the clearance between the discs being set as narrow as possible (e.g., 0.1 mm or less), the conditions of the refining treatment using a high-pressure homogenizer or the like can be relaxed, which may be effective in some cases.

A preferred degree of the beating treatment is determined as follows. According to the studies conducted by the present inventors, it was confirmed that the CSF value (which indicates the degree of cellulose beating and is evaluated by the Canadian standard freeness test method defined in JIS P8121) shows, as the beating treatment is performed, a tendency of once decreasing over time to nearly zero and then increasing again when the beating treatment is further continued, and it was thus found that, for the preparation of fine cellulose fibers, it is preferred as a pretreatment to further continue the beating treatment after the CSF value has approached zero and to thereby perform the beating to a state where the CSF value is increased. In the present specification, a CSF value in the course of decreasing from an unbeaten state is expressed as "* ml↓", while a CSF value in the trend of increasing after having decreased to zero is expressed as "* ml↑". In the heating treatment, regardless of whether the fibers are of regenerated cellulose or natural cellulose, the degree of beating in the beating step is preferably at least higher than a CSF value of zero, more preferably higher than a CSF value of 30 ml↑. In an aqueous dispersion prepared to have such a degree of beating, fibrillation proceeds to a high degree and, particularly for regenerated cellulose, fine fibers having a specific surface area-equivalent fiber diameter of 0.20 µm to 0.70 µm can be obtained by performing the beating treatment in combination with the below-described further refining treatment. An aqueous dispersion that has been highly beaten to have a CSF value of at least zero or a subsequently increasing value of *** ml↑ shows an improved uniformity and is thus advantageous in terms of the production efficiency since it can reduce clogging caused by a high-pressure homogenizer or the like in the subsequent refining treatment. Further, in the case of producing natural cellulose fine fibers, from the standpoint of reinforcing the strength of the resulting cellulose nanofiber nonwoven fabric, it is preferred that a slurry of the fine fibers be beaten to a CSF value of greater than 50 ml↑, more preferably a CSF value of 100 ml↑ or greater, by performing the above-described beating step in combination with a further refining treatment.

In the case producing regenerated cellulose fine fibers, from the standpoint of reinforcing the strength of the resulting cellulose nanofiber nonwoven fabric, it is preferred that a slurry of the fine fibers be beaten to a CSF value of greater than 20 ml↑, more preferably a CSF value of 50 ml↑ or greater, by performing the above-described beating step in combination with a further refining treatment.

In the production of cellulose fine fibers, it is preferred to perform a refining treatment using a high-pressure homogenizer, an ultrahigh-pressure homogenizer, a grinder or the like following the above-described beating step. In this process, the solid concentration in the aqueous dispersion is, in accordance with the above-described beating treatment, (15% by mass to 4% by mass, preferably 0.8% by mass to 3% by mass, more preferably 1.0% by mass to 2.5% by mass. When the solid concentration is in this range, clogging does not occur and the refining treatment can be achieved efficiently.

Examples of the high-pressure homogenizer to be used include a high-pressure homogenizer Model NS manufactured by Niro Soavi S.p.A. (Italy), a Lanier-type pressure homogenizer (Model R) manufactured by SMT Corporation and High-Pressure Homogenizer manufactured by Sanwa Engineering Ltd., and any other apparatus may also be used as long as it is capable of refining fibers by substantially the same mechanism as the above-exemplified apparatuses. The term "ultrahigh-pressure homogenizer" means a high-pressure collision-type refining machine, examples of which include Micro Fluidizer manufactured by MIZUHO Industrial Co., Ltd., Nanomizer manufactured by Yoshida Kikai Co., Ltd. and Ultimizer manufactured by Sugino Machine Ltd., and any other apparatus may also be used as long as it is capable of refining fibers by substantially the same mechanism as the above-exemplified apparatuses. Examples of a grinder-type refining machine include Pure Fine Mill manufactured by Kurita Machinery MFG. Co., Ltd. and SuperMassColloider manufactured by Masuko Sangyo Co., Ltd., and any other apparatus may also be used as long as it is capable of refining fibers by substantially the same mechanism as the above-exemplified apparatuses.

The diameter of the cellulose fine fibers can be controlled by adjusting the conditions of the refining treatment using a high-pressure homogenizer or the like (apparatus selection, operating pressure, and number of passes) or the conditions of the pretreatment (e.g., autoclaving treatment, enzyme treatment or beating treatment) performed prior to the refining treatment.

In the present invention, as the cellulose fine fibers, cellulose-based fine fibers subjected to a surface chemical treatment and cellulose-based fine fibers in which the hydroxyl group at the 6-position is oxidized to a carboxyl group (such as an acid-type or base-type carboxyl group) by a TEMPO oxidation catalyst can also be used. In the case of the former, by performing a variety of surface chemical treatments in accordance with the purpose, for example, cellulose fine fiber in which all or the majority of the hydroxyl groups present on the surface are esterified groups including acetic acid esters, nitric acid esters and sulfuric acid esters, or esterified groups including alkyl ethers represented by methyl ether, carboxy ethers represented by carboxymethyl ether and cyanoethyl ethers, can be prepared and used as appropriate. Further, in the case of the latter, that is, in the preparation of cellulose fine fibers in which the hydroxyl group at the 6-position is oxidized by a TEMPO oxidation catalyst, a dispersion of cellulose fine fibers can be obtained without necessarily needing to use a refining machine that requires a high energy, such as a high-pressure homogenizer. For example, as described in a document (A. Isogai et al., Biomacromolecules, 7, 1687-1691(2006)), a dispersion of fine cellulose fibers call be obtained extremely easily by allowing a catalyst called TEMPO such as 2,2,6, 6-tetramethylpiperidinooxy radical and an alkyl halide to coexist in an aqueous dispersion of natural cellulose, adding thereto an oxidizing agent such as hypochlorous acid, allowing the reaction to proceed for a certain period of time, performing a purification treatment such as washing with water, and then subjecting the resultant to an ordinary mixing treatment.

In the present invention, there are also cases where it is effective to form the cellulose fine fiber layer by mixing, in the amounts prescribed in the present invention, two or more of, for example, the above-described regenerated cellulose-based or natural cellulose-based fine fibers obtained from different raw materials, natural cellulose fine fibers having different fibrillation degrees and natural cellulose fine fibers whose surface has been chemically treated.

In the cellulose fine fiber layer used in the cellulose nanofiber nonwoven fabric, it may be effective to incorporate a reactive cross-linking agent in an amount of 10% by mass or less for the purpose of reinforcing the strength. The term "reactive cross-linking agent" refers to a reactant derived from a polyfunctional isocyanate, which is a resin generated by an addition reaction between a polyfunctional isocyanate compound and an active hydrogen-containing compound. By incorporating a reactive cross-linking agent in an amount of 10% by mass or less, the strength of the cellulose fine fiber layer is increased, allowing the cellulose nanofiber nonwoven fabric to have extremely good ease of handling in the assembly of a device. The amount of the reactive cross-linking agent to be incorporated is more preferably 6% by mass or less.

Examples of the polyfunctional isocyanate compound constituting the reactive cross-linking agent in the cellulose fine fiber layer used in the cellulose nanofiber nonwoven fabric include aromatic polyfunctional isocyanates, aromatic-aliphatic polyfunctional isocyanates, alicyclic polyfunctional isocyanates, and aliphatic polyfunctional isocyanates. Thereamong, from the standpoint of reducing yellowing, alicyclic polyfunctional isocyanates and aliphatic polyfunctional isocyanates are preferred. These polyfunctional isocyanate compounds may be incorporated individually, or in combination of two or more thereof.

Examples of the aromatic polyfunctional isocyanates include 2,4-tolylene diisocyanate, 2,6-tolylene diisocyanate and mixtures thereof (TDI), diphenylmethane-4,4'-diisocyanate (MDI), naphthalene-1,5-diisocyanate, 3,3-dimethyl-4, 4-biphenylene diisocyanate, crude TDI, polymethylene polyphenyl diisocyanate, crude MDI, phenylene diisocyanate, and xylylene diisocyanate.

Examples of the alicyclic polyfunctional isocyanates include 1,3-cyclopentane diisocyanate, 1,3-cyclopentene diisocyanate, and cyclohexane diisocyanate.

Examples of the aliphatic polyfunctional isocyanates include trimethylene diisocyanate, 1,2-propylene diisocyanate, butylene diisocyanate, pentamethylene diisocyanate, and hexamethylene diisocyanate.

Examples of the active hydrogen-containing compound include hydroxyl group-containing compounds, such as monohydric alcohols, polyhydric alcohols and phenols, amino group-containing compounds, thiol group-containing compounds, and carboxyl group-containing compounds, as well as water, carbon dioxide and the like that exist in the air or reaction field. These active hydrogen-containing compounds may be incorporated individually, or in combination of two or more thereof.

Examples of the monohydric alcohols include alkanols having 1 to 20 carbon atoms (e.g., methanol, ethanol, butanol, octanol, decanol, dodecyl alcohols, myristyl alcohols, cetyl alcohols, and stearyl alcohols), alkenols having 2 to 20 carbon atoms (e.g., oleyl alcohols and linoleyl alcohols), and aromatic-aliphatic alcohols having 7 to 20 carbon atoms (e.g., benzyl alcohols and naphthyl ethanol).

Examples of the polyhydric alcohols include dihydric alcohols having 2 to 20 carbon atoms [such as aliphatic diols (e.g., ethylene glycol, propylene glycol, 1,3- or 1,4-butanediol, 1,6-hexanediol, neopentyl glycol, and 1,10-decanediol), alicyclic diols (e.g., cyclohexanediol and cyclohexane dimethanol), aromatic-aliphatic diols [e.g., 1,4-bis(hydroxyethyl)benzene], trihydric alcohols having 3 to 20 carbon atoms [such as aliphatic triols (e.g., glycerin and trimethylolpropane)], and tetrahydric to octahydric alcohols having 5 to 20 carbon atoms [such as aliphatic polyols (e.g., pentaerythritol, sorbitol, mannitol, sorbitan, diglycerin, and dipentaerythritol) and saccharides (e.g., sucrose, glucose, mannose, fructose, methylglucoside, and derivatives thereof)].

Examples of the phenols include monohydric phenols (e.g., phenol, 1-hydroxynaphthalene, anthrol, and 1-hydroxypyrene) and polyhydric phenols [e.g., phloroglucinol, pyrogallol, catechol, hydroquinone, bisphenol A, bisphenol F, bisphenol S, 1,3,6,8-tetrahydroxynaphthalene, 1,4,5,8-tetrahydroxyanthracene, a condensate of phenol and formaldehyde (novolac), and polyphenols described in U.S. Pat. No. 3,265,641].

Examples of the amino group-containing compounds include monohydrocarbylamines having 1 to 20 carbon atoms [such as alkylamines (e.g., butylamine), benzylamine, and aniline]; aliphatic polyamines having 2 to 20 carbon atoms (e.g., ethylene diamine, hexamethylene diamine, and diethylene triamine); alicyclic polyamines having 6 to 20 carbon atoms (e.g., diaminocyclohexane, dicyclohexylmethane diamine, and isophorone diamine); aromatic polyamines having 2 to 20 carbon atoms (e.g., phenylene diamine, tolylene diamine, and diphenylmethane diamine); heterocyclic polyamines having 2 to 20 carbon atoms (e.g., piperazine and N-aminoethyl piperazine); alkanolamines (e.g., monoethanolamine, diethanolamine, and triethanolamine); polyamide polyamines obtained by condensation of a dicarboxylic acid and excess polyamine; polyether polyamines; hydrazines (e.g., hydrazine and monoalkyl hydrazine), dihydrazides (e.g., succinic dihydrazide and terephthalic dihydrazide); guanidines (e.g., butylguanidine and 1-cyanoguanidine); and dicyandiamide.

Examples of the thiol group-containing compounds include monovalent thiol compounds having 1 to 20 carbon atoms (e.g., alkyl thiols such as ethyl thiol, phenyl thiol, and benzyl thiol), and polyvalent thiol compounds (e.g., ethylenedithiol and 1,6-hexanedithiol).

Examples of the carboxyl group-containing compounds include monocarboxyl acid compounds (e.g., alkyl carboxylic acids such as acetic acid, and aromatic carboxylic acids such as benzoic acid), and polycarboxylic acid compounds (e.g., alkyl dicarboxylic acids such as oxalic acid and malonic acid, and aromatic dicarboxylic acids such as terephthalic acid).

In addition to the cellulose fine fiber layer containing not less than 70% by mass of regenerated cellulose fine fibers, the cellulose nanofiber nonwoven fabric may also contain a base material layer that is a nonwoven fabric or paper having a basis weight of 3 g/m$^2$ to 15 g/m$^2$ as one of the not more than three plural layers of the multilayer structure. By incorporating the base material layer that is a nonwoven fabric or paper having a basis weight of 3 g/m$^2$ to 1.5 g/m$^2$, even when the thin cellulose fine fiber layer itself does not have sufficient strength, since the base material layer supplements the strength, a resin-containing sheet having extremely good ease of handling in the assembly of a device can be obtained while maintaining the function as a cellulose nanofiber nonwoven fabric (e.g., low internal resistance as a resin-containing sheet).

The base material layer used in the cellulose nanofiber nonwoven fabric is, for example, a nonwoven fabric or paper which is composed of at least one selected from the group consisting of: polyamide fibers such as 6-nylon and 6,6-nylon; polyester fibers made of polyethylene terephthalate, polytrimethylene terephthalate, polybutylene terephthalate or the like; polyethylene fibers; polypropylene fibers; natural cellulose fibers such as wood pulps and cotton linter; regenerated cellulose fibers such as viscose rayon and cuprammonium rayon; and purified cellulose fibers such as lyocell and tencel. From the standpoint of the impregnation with an electrolyte solution or a composite resin, the base material layer is preferably made of cellulose. Further, as the base material layer, a nonwoven fabric melt-blown from the film thickness range prescribed in the present invention or an electrospun-type nonwoven fabric can be preferably used, and it is more preferred to use a base material made into a thin film by a calendaring treatment.

In the cellulose nanofiber nonwoven fabric, depending on the use thereof, it is preferred that the chloride ion concentration, which serves as an index of the amount of contained metal ions, be 40 ppm or less. The reason for this is because, when the chloride ion concentration is 40 ppm or less, metal ions of Na, Ca and the like are also contained at relatively low concentrations and consequently, for example, interference with the electrical characteristics of a device such as a printed wiring board can be suppressed. The chloride ion concentration is more preferably 30 ppm or less, most preferably 25 ppm or less, since heat resistance is more suitably expressed at such a chloride ion concentration. The chloride ion concentration can be evaluated by ion chromatography.

[Fixing Agent Composition]

The fixing agent composition constituting the fixing agent 2 may be any composition as long as it is capable of adhering to the fibers 1 in the cellulose nanofiber nonwoven fabric 11 and fixing together the fibers 1, and the fixing agent composition may be one which fixes the fibers 1 only at those parts where the fibers 1 are in contact with one another, or one which fixes the fibers 1 by covering the entirety thereof. The fixing agent composition may be used in any amount as long as it is such an amount that allows the fibers 1 to be fixed with one another and does not adversely affect the flexural resistance and, in the aggregates formed by the fixation of the fibers 1 with the fixing agent 2, it is preferred that the volume ratio of the fibers 1 and the fixing agent 2 be in a range of 99:1to 50:50, particularly in a range of 99:1 to 60:40, in terms of the solid content excluding organic solvent. The volume ratio of the fibers 1 and the fixing agent 2 is preferably in this range because not only the fibers 1 are sufficiently fixed together by the fixing agent and a desired high strength can thus be attained, but also good flexural resistance can be ensured by the subsequent impregnation with the resin 3. It is particularly preferred that the fixing agent 2 be used in such an amount at which the film thickness of the cellulose nanofiber nonwoven fabric 11 does not substantially change before and after the application of the fixing agent 2. The expression "the film thickness does not substantially change" used herein means that the change in the film thickness does not include such a case where the apparent thickness of the cellulose nanofiber nonwoven fabric 11 is increased due to swelling with the solvent component or the like of the fixing agent composition. Further, the fixing agent composition is preferably in the form of a liquid when adhered to the fibers, and the fixing agent composition may be one which, upon the use thereof, can be converted into a liquid by changing the temperature or pressure. Particularly, it is preferred that the viscosity of the fixing agent composition, which is measured by an E-type viscometer at a temperature of 25° C. and a rotor speed of 5 rpm, be 1 Pa·s or less, for example, 0.0001 to 1 Pa·s. This allows the fixing agent composition to be impregnated into the inside of the aggregates of the fibers 1, so that the fibers 1 can be more certainly fixed together.

As the fixing agent composition, one which is cured by heat or light is used. The term "cured" used herein means that the fixing agent composition is chemically changed from a liquid state to a solid state by thermal or light energy. As the fixing agent composition, a commonly used component can be used in accordance with the intended use thereof, and such a component may be used individually, or in combination of two or more thereof. Examples of the commonly used component that can be used as the fixing agent composition include a thermosetting resin, a curing agent, a heat-curing agent, a photocurable resin, a photopolymerization initiator, photoacid generator, a photobase generator and an organic solvent and, specifically, the below-described components can be used.

(Thermosetting Resin)

The thermosetting resin may be any resin as long as it is cured by heating and exhibits electrical insulating properties, and examples thereof include bisphenol-type epoxy resins, such as bisphenol A-type epoxy resins, bisphenol F-type epoxy resins, bisphenol S-type epoxy resins, bisphenol E-type epoxy resins, bisphenol M-type epoxy resins, bisphenol P-type epoxy resins and bisphenol Z-type epoxy resins; novolac-type epoxy resins, such as bisphenol A novolac-type epoxy resins, phenol novolac-type epoxy resins and cresol novolac epoxy resins; biphenyl-type epoxy resins; biphenyl aralkyl-type epoxy resins; arylalkylene-type epoxy resins; tetraphenylolethane-type epoxy resins; naphthalene-type epoxy resins; anthracene-type epoxy resins; phenoxy-type epoxy resins; dicyclopentadiene-type epoxy resins; norbornene-type epoxy resins; adamantane-type epoxy resins; fluorene-type epoxy resins; glycidyl methacrylate copolymer-based epoxy resins; cyclohexylmaleimide-glycidyl methacrylate copolymer epoxy resins; epoxy-modified polybutadiene rubber derivatives; CTBN-modified epoxy resins; trimethylolpropane polyglycidyl ether; phenyl-1,3-diglycidyl ether; biphenyl-4,4'-diglycidyl ether; 1,6-hexanediol diglycidyl ether; diglycidyl ether of ethylene glycol or propylene glycol sorbitol polyglycidyl ether; tris (2,3-epoxypropyl)isocyanurate; triglycidyl tris(2-hydroxyethyl)isocyanurate; novolac-type phenol resins, such as phenol novolac resins, cresol novolac resins and bisphenol A novolac resins; phenol resins such as resol-type phenol resins (e.g., unmodified resol phenol resins, and oil-modified resol phenol resins modified with tung oil, linseed oil, walnut oil or the like); phenoxy resins; urea resins; triazine ring-containing resins such as melamine resins; unsaturated polyester resins; bismaleimide resins; diallylphthatate resins; silicone resins; benzoxazine ring-containing resins; norbornene-based resins; cyanate resins; isocyanate resins; urethane resins; benzocyclobutene resins; maleimide resins; bismaleimide triazine resins; polyazomethine resins; and polyimide resins. Thereamong, particularly, epoxy resins and polyimide resins are preferred since these resins exhibit excellent reliability as an insulating layer.

As an epoxy resin, any known and commonly used polyfunctional epoxy resin having at least two epoxy groups in one molecule can be used. The epoxy resin may be in a liquid form, or in a solid or semisolid form. Thereamong, particularly, bisphenol A-type epoxy resins, naphthalene-type epoxy resins, phenol novolac-type epoxy resins, and mixtures thereof are preferred. These epoxy resins may be used individually, or in combination of two or more thereof. Specific examples of these epoxy resins include, but not limited to, jER828 manufactured by Mitsubishi Chemical Corporation.

In cases where a cured article is formed using an epoxy resin, it is preferred to incorporate a curing agent in addition to the epoxy resin. Examples of a curing agent that can be used include imidazole-based curing agents, such as 2-ethyl-4-methylimidazole (2E4MZ), 2-phenylimidazole (2PZ) and 2-phenyl-4-methyl-5-hydroxymethylimidazole (2P4MHZ); amine-based curing agents, such as diethylene amine, triethylene tetramine, tetraethylene pentamine, pentaethyleue hexamine, metaxylene diamine, isophorone diamine, norbornene diamine, 1,3-bisaminomethylcyclohexane and N-aminoethyl piperazine; phenol-based curing agents, such as polyamide, vinyl phenol, aralkyl-type phenol resins, phenol phenylaralkyl resins and phenol biphenylaralkyl resins; acid anhydride-based curing agents, such as phthalic anhydride, tetrahydrophthalic anhydride, hexahydrophthalic anhydride, methyltetrahydrophthalic anhydride, methylhexahydrophthalic anhydride, methylnadic anhydride, dodecylsuccinic anhydride, chiorendic anhydride, pyromellitic anhydride, benzophenone tetracarboxylic anhydride, ethylene glycol bis(anhydrotrimellitate) and methylcyclohexene tetracarboxylic anhydride; and known curing agents, such as cyanate ester resins, active ester resins, aliphatic or aromatic primary or secondary amines, polyamide resins and polymercapto compounds. The curing agent is added in an amount of preferably 0.1 to 150 parts by mass, more preferably 0.5 to 100 parts by mass, with respect to 100 parts by mass of the epoxy resin. By adding the curing agent in an amount of 0.1 parts by mass or greater, the resin composition can be sufficiently cured while, by adding the curing agent in an amount of 150 parts by mass or less, an effect corresponding to the added amount can be efficiently obtained.

Examples of the heat-curing catalyst include imidazole derivatives, such as imidazole, 2-methylimidazole, 2-ethylimidazole, 2-ethyl-4-methylimidazole, 2-phenylimidazole, 4-phenylimidazole, 1-cyanoethyl-2-phenylimidazole and 1-(2-cyanoethyl)-2-ethyl-4-methylimidazole; amine compounds, such as dicyandiamide, benzyldimethylamine, 4-(dimethylamino)-N,N-dimethylbenzylamine, 4-methoxy-N,N-dimethylbenzylamine and 4-methyl-N,N-dimethylbenzylamine; hydrazine compounds, such as adipic acid dihydrazide and sebacic acid dihydrazide; and phosphorus compounds such as triphenyl phosphine. Further, art s-triazine derivative, such as guanamine, acetoguanamine, benzoguanamine, melamine, 2,4-diamino-6-methacryloyloxyethyl-s-triazine, 2-vinyl-2,4-diamino-s-triazine, isocyanuric acid adduct of 2-vinyl-4,6-diamino-s-triazine or isocyanuric acid adduct of 2,4-diamine-6-methacryloyloxyethyl-s-triazine, can be used as well.

Examples of the polyimide resins include those which are obtained through a polyamic acid (polyimide precursor) by a synthesis reaction between a generally known aromatic polycarboxylic anhydride or a derivative thereof and an aromatic diamine; and those which are commercially available as so-called polyimide varnish in a state where a polyamic acid composition is already dissolved in an organic solvent.

Specific examples of the aromatic polycarboxylic anhydride include pyromellitic dianhydride, 3,3',4,4'-benzophenone tetracarboxylic dianhydride, 2,2',3,3'-benzophenone tetracarboxylic dianhydride, 3,3',4,4'-biphenyltetracarboxylic dianhydride, 2,2',3,3'-biphenyltetracarboxylic dianhydride, 2,2-bis(2,3-dicarboxyphenyl)propane dianhydride, bis(3,4-dicarboxyphenyl)ether dianhydride, bis(3,4-dicarboxyphenyl)sulfone dianhydride, 1,1-bis(2,3-dicarboxyphenyl)ethane dianhydride, bis(2,3-dicarboxyphenyl)methane danhydride, bis(3,4-dicarboxyphenyl)Methane danhydride, 2,2-bis(3,4-dicarboxylphenyl)-1,1,1,3,3,3-hexafluoropropane dianhydride, 2,3,6,7-naphthalene tetracarboxylic dianhydride, 1,4,5,8-naphthalene tetracarboxylic dianhydride, 1,2,5,6-naphthalene tetracarboxylic dianhydride, 1,2,3,4-benzene tetracarboxylic dianhydride, 3,4,9,10-perylene tetracarboxylic dianhydride, 2,3,6,7-anthracene tetracarboxylic danhydride, and 1,2,7,8-phenanthrene tetracarboxylic dianhydride. These aromatic polycarboxylic anhydrides may be used individually, or in combination of two or more thereof. Thereamong, particularly, pyromellitic dianhydride is preferably used as at least one component.

Specific examples of the aromatic diamine to be reacted with a polycarboxylic acid such as an aromatic polycarboxylic anhydride include m-phenylenediamine, o-phenylenediamine, p-phenylenediamine, m-aminobenzylamine, p-aminobenzylamine, 4,4'-diaminodiphenyl ether, 3,3'-diaminodiphenyl ether, 3,4'-diaminotilphenyl ether, bis(3-aminophenyl)sulfide, (3-aminophenyl)(4-aminophenyl)sulfide, bis(4-aminophenyl)sulfide, bis(3-aminophenyl)sulfide, (3-aminophenyl)(4-aminophenyl)sulfoxide, bis(3-aminophenyl)sulfone, (3-aminophenyl)(4-aminophenyl)sulfone, bis(4-aminophenyl)sulfone, 3,3'-diaminobenzophenone, 3,4'-diaminobenzophenone, 4,4'-diaminobenzophenone, 3,3'-diaminodiphenylmethane, 3,4'-diaminodiphenylmethane, 4,4'-diaminodiphenylmethane, bis[4-(3-aminophenoxy)phenyl]methane, bis[4-(4-aminophenoxy)phenyl]methane, 1,1-bis[4-(3-aminophenoxy)phenyl]ethane, 1,1-bis[4-(4-aminophenoxy)phenyl]ethane, 1,2-bis[4-(3-aminophenoxy)phenyl]ethane, 1,2-bis[4-(4-aminophenoxy)phenyl]ethane, 2,2-bis[4-(3-aminophenoxy)phenyl]propane, 2,2-bis[4-(4-aminophenoxy)phenyl]propane, 2,2-bis[4-(3-aminophenoxy)phenyl] butane, 2,2-bis[3-(3-aminophenoxy)phenyl]-1,1,1,3,3,3-hexafluoropropane, 2,2-bis[4-(4-aminophenoxy)phenyl]-1,1 1,3,3,3-hexafluoropropane, 1,3-bis(3-aminophenoxy)benzene, 1,3-bis(4-aminophenoxy)benzene, 1,4-bis(3-aminophenoxy)benzene, 1,4-bis(4-aminophenoxy)benzene, 4,4'-bis(3-aminophenoxy)biphenyl, 4,4'-bis(4-aminophenoxy)biphenyl, bis[4-(3-aminophenoxy)phenyl]ketone, bis[4-(4-aminophenoxy)phenyl]ketone, bis[4-(3-aminophenoxy)phenyl]sulfide, bis[4-(4-aminophenoxy)phenyl]sulfide, bis[4-(3-aminophenoxy)phenyl]sulfoxide, bis[4-(4-aminophenoxy)phenyl]sulfoxide, bis[4-(3-aminophenoxy)phenyl]sulfone, bis[4-(4-aminophenoxy)phenyl]sulfone, bis[4-(3-aminophenoxy)phenyl]ether, bis[4-(4-aminophenoxy)phenyl]ether, 1,4-bis[4-(3-aminophenoxy)benzoyl]benzene, 1,3-bis[4-(3-aminophenoxy)benzoyl]benzene, 4,4'-bis[3-(4-aminophenoxy)benzoyl]diphenyl ether, 4,4'-bis[3-(3-aminophenoxy)benzoyl]diphenyl ether, 4,4'-bis[4-(4-amino-α,α-dimethylbenzyl)phenoxy]benzophenone, 4,4'-bis[4-(4-amino-α,α-dimethylbenzyl)phenoxy]diphenyl sulfone, bis[4-{4-(4-aminophenoxy)phenoxy}phenyl]sulfone, 1,4-bis[4-(4-aminophenoxy)phenoxy]-α,α-dimethylbenzyl]benzene, and 1,3-bis[4-(4-aminophenoxy)-α,α-dimethylbenzyl]benzene. These aromatic diamines may be used individually, or in combination of two or more thereof. Thereamong, particularly, 4,4'-diaminodiphenyl ether is preferably used as at least one component.

Examples of the polyimide varnish include RIKACOAT SN20, RIKACOAT PN20 and RIKACOAT EN20, all of which are manufactured by New Japan Chemical Co., Ltd.; TORAYNEECE manufactured by Toray Industries, Inc.; U-VARNISH manufactured by Ube Industries, Ltd.; OPTMER manufactured by JSR Corporation; SE812 manufactured by Nissan Chemical Industries, Ltd.; and CRC8000 manufactured by Sumitomo Bakelite Co., Ltd.

By treating a polyamic acid solution, which is obtained by a synthesis reaction or commercially available, with heat or the like, cyclization of the polyamic acid into a polyimide (imidization) is carried out. The polyamic acid can be imidized by a method which utilizes only heating or by a chemical method. In the case of the method which utilizes only heating, the polyamic acid is imidized by heating at, for example, 200 to 350° C. The chemical method is a method in which the polyamic acid is heated and completely imidized while utilizing a basic catalyst to allow the imidization to promptly progress. The basic catalyst is not particularly restricted, and a conventionally known basic catalyst, examples of which include pyridine, diazabicycloundecene (DBU), diazabicyclononene (DBN) and various tertiary amines, can be used. These basic catalysts may be used individually, or in combination of two or more thereof.

(Photocurable Resin)

As the photocurable resin, any resin that is cured by irradiation with an active energy ray and exhibits electrical insulating properties can be used and, particularly, a compound having at least one ethylenically unsaturated bond in the molecule is preferably used. As the ethylenically unsaturated bond-containing compound, for example, a known and commonly used photopolymerizable oligomer or photopolymerizable vinyl monomer can be used.

Examples of the photopolymerizable oligomer include unsaturated polyester oligomers and (meth)acrylate oligomers. Examples of the (meth)acrylate oligomers include epoxy(meth)acrylates, such as phenol novolac epoxy(meth)acrylate, cresol novolac epoxy(meth)acrylate and bisphenol-type epoxy(meth)acrylate; urethane (meth)acrylate, epoxyurethane (meth)acrylate; polyester (meth)acrylate; polyether (meth)acrylate; and polybutadiene-modified (meth)acrylate. It is noted here that the term "(meth)acrylate" used herein is a general term for acrylates, methacrylates and mixtures thereof, and this is hereinafter applicable to all other similar expressions.

Examples of the photopolymerizable vinyl monomer include those which are known and commonly used, for example, styrene derivatives, such as styrene, chlorostyrene and α-methylstyrene; vinyl esters, such as vinyl acetate, vinyl butyrate and vinyl benzoate; vinyl ethers, such as vinylisobutyl ether, vinyl-n-butyl ether, vinyl-t-butyl ether, vinyl-n-amyl ether, vinylisoamyl ether, vinyl-n-octadecyl ether, vinylcyclohexyl ether, ethylene glycol. monobutylvinyl ether and triethylene glycol monomethylvinyl ether; (meth)acrylamides, such as acrylamide, methacrylamide, N-hydroxymethylacrylamide, N-hydroxymethyl methacrylamide, N-methoxymethylacrylamide, N-ethoxymethylacrylamide and N-butoxymethylacrylamide; allyl compounds, such as triallyl isocyanurate, diallyl phthalate and diallyl isophthalate; (meth)acrylic acid esters, such as 2-ethylhexyl (meth)acrylate, lauryl (meth)acrylate, tetrahydrofurfuryl (meth)acrylate, isobornyl (meth)acrylate, phenyl (meth) acrylate and phenoxyethyl (meth)acrylate; hydroxyalkyl (meth)acrylates, such as hydroxyethyl(meth)acrylate, hydroxypropyl (meth)acrylate and pentaerythritol tri(meth) acrylate; alkoxyalkylene glycol mono(meth)acrylates, such as methoxyethyl (meth)acrylate and ethoxyethyl (meth) acrylate; alkylene polyol poly(meth)acrylates, such as ethylene glycol di(meth)acrylate, butanediol di(meth)acrylate, neopentyl glycol di(meth)acrylate, 1,6-hexanediol di(meth) acrylate, trimethylolpropane tri(meth)acrylate, pentaerythritol tetra(meth)acrylate and dipentaerythritol hexa(meth) acrylate; polyoxyalkylene glycol poly(meth)acrylates, such as diethylene glycol di(meth)acrylate, triethylene glycol di(meth)acrylate, ethoxylated trimethylolpropane triacrylate and propoxylated trimethylolpropane tri(meth)acrylate; poly (meth)acrylates such as hydroxypivalic acid neopentyl glycol ester di(meth)acrylate; and isocyanurate-type poly(meth) acrylates such as tris[(meth)acryloxyethyl]isocyanurate.

As the photocurable resin, for example, alicyclic epoxy compounds, oxetane compounds and vinyl ether compounds can also be suitably used. Thereamong, examples of the alicyclic; epoxy compounds include epoxy group-containing alicyclic epoxy compounds such as 3,4,3',4'-diepoxybicyclohexyl, 2,2-bis(3,4-epoxycyclohexyl)propane, 2,2-bis(3,4-epoxycyclohexyl)-1,3-hexafluoropropane, bis(3,4-epoxycyclohexyl)methane, 1-[1,1-bis(3,4-epoxycyclohexyl)] ethylbenzene, bis(3,4-epoxycyclohexyl)adipate, 3,4-epoxycyclohexylmethyl(3,4-epoxy)cyclohexane carboxylate, (3,4-epoxy-6-methylcyclohexyl)methyl-3',4'-epoxy-6-methylcyclohexane carboxylate, ethylene-1,2-bis (3,4-epoxycyclohexanecarboxylic acid)ester, cyclohexene oxide, 3,4-epoxycyclohexylmethyl alcohols, and 3,4-epoxycyclohexylethyltrimethoxysilane.

Examples of the oxetane compounds include polyfunctional oxetane compounds, such as polyfunctional oxetanes such as bis[(3-methyl-3-oxetanylmethoxy)methyl]ether, bis [(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methyl acrylate, (3-ethyl-3-oxetanyl)methyl acrylate, (3-methyl-3-oxetanyl)methyl methacrylate, (3-ethyl-3-oxetanyl)methyl methacrylate, and oligomers and copolymers thereof; etherification products of an oxetane alcohol and a hydroxyl group-containing resin such as a novolac resin, poly(p-hydroxystyrene), cardo-type bisphenol, calixarene, calixresorcinarene or silsesquioxane; and copolymers of an oxetane ring-containing unsaturated monomer(s) and an alkyl (meth)acrylate.

Examples of the vinyl ether compounds include cyclic ether-type vinyl ethers, such as isosorbide divinyl ether and oxanorbornene divinyl ether (vinyl ethers having a cyclic ether group such as oxirane ring, an oxetane ring or an oxolane ring); arylvinyl ethers such as phenylvinyl ether; alkylvinyl ethers, such as n-butylvinyl ether and octylvinyl ether; cycloalkylvinyl ethers such as cyclohexylvinyl ether; polyfunctional vinyl ethers, such as hydroquinone divinyl ether, 1,4-butanediol divinyl ether, cyclohexane divinyl ether, cyclohexanedimethanol divinyl ether; and vinyl ether compounds having a substituent, such as an alkyl group or an allyl group, at the α- and/or β-position. Examples of commercially available products thereof include 2-hydroxyethylvinyl ether (HEVE), diethylene glycol monovinyl ether (DEGV), 2-hydroxybutylvinyl ether (HBVE) and triethylene glycol divinyl ether, which are manufactured by Maruzen Petrochemical Co., Ltd.

When a photocurable resin is used, in addition to the photocurahle resin, for example, a photopolymerization initiator, a photoacid generator or a photobase generator may be used individually, or two or more thereof may be used in combination.

Examples of the photopolymerization initiator include benzoins and benzoin alkyl ethers, such as benzoin, benzoin methyl ether, benzoin ethyl ether and benzoin isopropyl ether; acetophenones, such as acetophenone, 2,2-dimethoxy-2-phenyl acetophenone, 2,2-diethoxy-2-phenyl acetophenone and 1,1-dichloroacetophenone; aminoalkylphenones, such as 2-methyl-1-[4-(methylthio)phenyl]-2-morpholinopropane-1-one, 2-benzyl-2-dimethylamino-1-(4-morpholinophenyl)-butane-1-one and 2-(dimethylamino)-2-[(4-methylphenyl)methyl]-1-[4-(4-morpholinyl)phenyl]-1-butanone; anthraquinones, such as 2-methylanthraquinone, 2-ethylanthraquinone, 2-t-butyl anthraquinone and 1-chloroanthraquinone; thioxanthones, such as 2,4-dimethylthioxanthone, 2,4-diethylthioxanthone, 2-chlorothioxanthone and 2,4-diisopropylthioxanthone; ketals, such as acetophenone dimethyl ketal and benzyl dimethyl ketal; benzophenones such as benzophenone; xanthones; phosphine oxides, such as (2,6-dimethoxybenzoyl)-2,4,4-pentylphosphine oxide, bis(2,4,6-trimethylbenzoyl)-phenylphosphine oxide, 2,4,6-trimethylbenzoyldiphenylphosphine oxide and ethyl-2,4,6-trimethylbenzoylphenyl phosphinate; various peroxides; titanocene-based initiators; and oxime ester-based initiators. These photopolymerization initiators may be used in combination with a photosensitizer, examples of which include tertiary amines, such as ethyl-N,N-dimethylaminobenzoate, isoamyl-N,N-dimethylaminobenzoate, pentyl-4-dimethylaminobenzoate, triethylamine and triethanolamine. These photopolymerization initiators may be used individually, or in combination of two or more thereof.

Examples of the photoacid generator include onium salts, such as diazonium salts, iodonium salts, bromonium salts, chloronium salts, sulfonium salts, selenium salts, pyrylium salts, thiapyrylium salts and pyridinium salts; halogenated compounds, such as tris(trihalomethyl)-s-triazine (e.g., 2,4,6-tris(trichloromethyl)-s-triazine), 2-[2-(5-methylfuran-2-yl)ethenyl]-4,6-bis(trichloromethyl)-s-triazine, 2-[2-(furan-2-yl)ethenyl]-4,6-bis(trichloromethyl)-s-triazine, 2-(4-methoxyphenyl)-4,6-bis(trichloromethyl)-s-triazine and 2-methyl-4,6-bis(trichloromethyl)-s-triazine; 2-nitrobenzyl esters of sulfonic acids; iminosulfonate; 1-oxo-2-diazonaphthoquinone-4-sulfonate derivatives; N-hydroxyimide sulfonate; tri(methanesulfonyloxy)benzene derivatives; bis-sulfonyldiazomethane; sulfonylcarbonyl alkanes; sulfonylcarbonyl diazomethane; disulfone compounds; and iron-allene complexes. These photoacid generators may be used individually, or in combination of two or more thereof.

The photobase generator is a compound which, when its molecular structure is modified or the molecule is cleaved by photoirradiation with UV light, visible light or the like, generates at least one basic substance capable of functioning as a catalyst of a polymerization reaction. Examples of the basic substance include secondary amines and tertiary amines. Examples of the photobase generator include α-amino acetophenone compounds, oxime ester compounds, and compounds having a substituent such as an acyloxyimino group, an N-formylated aromatic amino group, an N-acylated aromatic amino group, a nitrobenzylcarbamate group or an alkoxybenzylcarbamate group. These photobase generators may be used individually, or in combination of two or more thereof.

Examples of the organic solvent include ketones, such as acetone, methyl ethyl ketone and cyclohexanone; aromatic hydrocarbons, such as toluene, xylene and tetramethylbenzene; glycol ethers, such as methyl cellosolve, ethyl cellosolve, butyl cellosolve, methyl carbitol, butyl carbitol, propylene glycol monomethyl ether, diethylene glycol monoethyl ether, dipropylene glycol monoethyl ether and triethylene glycol monoethyl ether; esters, such as ethyl acetate, butyl acetate, cellosolve acetate, diethylene glycol monoethyl ether acetate, and esterification products of the above-described glycol ethers; alcohols, such as ethanol, propanol, ethylene glycol and propylene glycol; amides, such as 1-methyl-2-pyrrolidinone, 1,3-dimethyl-2-imidazolidinone, 2-pyrrolidinone, ε-caprolactam, formamide, N-methylformamide, N,N-dimethylformamide, acetamide and N-methylacetamide; ethers such as tetrahydrofuran and dioxane; nitriles, such as acetonitrile, benzonitrile and propionitrile; halogens, such as chloroform, dichloromethane, bromobenzene, dibromobenzene, chlorobenzene and dichlorobenzene; amines, such as N-methyl-2-pyrrolidone, dimethylaniline, dibutylaniline and diisopropylaniline; sulfur-containing solvents, such as dimethylsulfoxide and sulfolane; aliphatic hydrocarbons, such as octane and decane; and petroleum-based solvents, such as petroleum ether, petroleum naphtha, hydrogenated petroleum naphtha and solvent naphtha. Thereamong, N-methyl-2-pyrrolidone and methyl ethyl ketone are preferred because of their ease of handling.

[Resin Composition]

In the resin-containing sheet of the present invention, the resin 3 is in contact with the fixing agent 2 and the cellulose nanofiber nonwoven fabric 11. In the present invention, the resin 3 may be contained in such an amount that does not impair the elasticity and the flexural resistance, and the resin 3 may cover the outside of the cellulose nanofiber nonwoven fabric 11. The impregnation ratio of the resin composition is not particularly restricted as long as it is at such a level that does not impair the storage modulus and the flexural resistance of the resin-containing sheet; however, the concentration of the resin in the resin-containing sheet is 10 to 99% by volume, particularly preferably 10 to 70% by volume. By controlling the impregnation ratio of the resin composition in this range, good flexural resistance and high strength can be attained in a well-balanced manner.

The resin composition constituting the resin 3 may be one which contains at least one selected from thermosetting resins, photocurable resins and thermoplastic resins and, depending on the intended use, these resins may be used individually, or in combination of two or more thereof. Thereamong, from the standpoint of the physical properties of the resulting cured article or molded article, thermosetting resins are preferred, and it is more preferred to use an epoxy resin. In cases where a thermosetting resin and/or a photocurable resin is used as the resin composition, the same thermoplastic resins, photocurable resins, organic solvents and the like as those exemplified above for the fixing agent composition can be used as appropriate; however, in the present invention, it is required that the resin composition and the fixing agent composition be each composed of different components. As the thermoplastic resins, the below-exemplified resins can be used.

(Thermoplastic Resin)

Examples of the thermoplastic resins that can be used include general-purpose plastics, such as acryl, modified acryl, low-density polyethylenes, high-density polyethylenes, ethylene-vinyl acetate copolymers, polyethylene terephthalates, polypropylenes, modified polypropylenes, polystyrenes, acrylonitrile-butadiene-styrene copolymers, acrylonitrile-styrene copolymers, cellulose acetate, polyvinyl alcohols, polyvinyl chlorides, polyvinylidene chlorides and polylactic acids; engineering plastics, such as polyamides, thermoplastic polyurethanes, polyacetals, polycarbonates, ultrahigh-molecular-weight polyethylenes, polybutylene terephthalates, modified polyphenylene ethers, polysulfones (PSF), polyphenylene sulfides (PPS), polyether sulfones (PBS), polyether ether ketones, polyarylates, polyether imides, polyamide imides, liquid crystal polymers, polyamide 6T, polyamide 9T, polytetrafluoroethylenes, polyvinylidene fluorides, polyester imides and thermoplastic polyimides; and olefin-based, styrene-based, polyester-based, urethane-based, amide-based, vinyl chloride-based, and hydrogenated thermoplastic elastomers. In the present invention, a resin composite can also be used and, for example, as a resin composite of a thermosetting resin and a thermoplastic resin, epoxy resin-PSF, epoxy resin-PPS, epoxy resin-PES or the like can be used.

In the fixing agent composition and the resin composition according to the present invention, a colorant may also be incorporated as other component.

As the colorant, any known and commonly used colorant that is indicated as a color pigment, a dye or the like in the color index can be used. Examples thereof include Pigment Blue 15, 15:1, 15:2, 15:3, 15:4, 15:6, 16, and 60; Solvent Blue 35, 63, 68, 70, 83, 87, 94, 97, 122, 136, and 67; Pigment Green 7, 36, 3, 5, 20, and 28; Solvent Yellow 163; Pigment Yellow 24, 108, 193, 147, 199, 202, 110, 109, 139, 179, 185, 93, 94, 95, 128, 155, 166, 180, 120, 151, 154, 156, 175, 181, 1, 2, 3, 4, 5, 6, 9, 10, 12, 61, 62, 62:1, 65, 73, 74, 75, 97, 100, 104, 105, 111, 116, 167, 168, 169, 182, 183, 12, 13, 14, 16, 17, 55, 63, 81, 83, 87, 126, 127, 152, 170, 172, 174, 176, 188, and 198; Pigment Orange 1, 5, 13, 14, 16, 17, 24, 34, 36, 38, 40, 43, 46, 49, 51, 61, 63, 64, 71, and 73; Pigment Red 1, 2, 3, 4, 5, 6, 8, 9, 12, 14, 15, 16, 17, 21, 22, 23, 31, 32, 112, 114, 146, 147, 151, 170, 184, 187, 188, 193, 210, 245, 253, 258, 266, 267, 268, 269, 37, 38, 41, 48:1, 48:2, 48:3, 48:4, 49:1, 49:2, 50:1, 52:1, 52:2, 53:1, 53:2, 57:1, 58:4, 63:1, 63:2, 64:1, 68, 171, 175, 176, 185, 208, 123, 149, 166, 178, 179, 190, 194, 224, 254, 255, 264, 270, 272, 220, 144, 166, 214, 220, 221, 242, 168, 177, 216, 122, 202, 206, 207, and 209; Solvent Red 135, 179, 149, 150, 52, and 207; Pigment Violet 19, 23, 29, 32, 36, 38, and 42; Solvent Violet 13 and 36; Pigment Brown 23 and 25; and Pigment Black 1 and 7.

Further, the fixing agent composition and the resin composition according to the present invention, as required, a commonly used additive(s), such as an antifoaming/leveling agent, a thixotropy-imparting/thickening agent, a coupling agent, a dispersant and/or a flame retardant can be incorporated.

Examples of the antifoaming/leveling agent that can be used include compounds such as mineral oils, vegetable oils, aliphatic alcohols, fatty acids, metal soaps, fatty acid amides, polyoxyalkylene glycols, polyoxyalkylene alkyl ethers, and polyoxyalkylene fatty acid esters.

Examples of the thixotropy-imparting/thickening agent that can be used include clay minerals, such as kaolinite, smectite, montmorillonite, bentonite, talc, mica and zeolite; amorphous inorganic particles; polyamide-based additives; modified urea-based additives; and wax-type additives.

Examples of the coupling agent that can be used include silane coupling agents which contains a methoxy group, an ethoxy group, an acetyl group or the like as an alkoxy group and vinyl, methacryl, acryl, epoxy, cyclic epoxy, mercapto, amino, diamino, acid anhydride, ureido, sulfide, isocyanate or the like as a reactive functional group, such as vinyl-based silane compounds (e.g., vinylethoxysilane, vinyltrimethoxysilane, vinyl-tris(β-methoxyethoxy)silane, and γ-methacryloxypropyltrimethoxysilane), amino-based silane compounds (e.g., γ-aminopropyl trimethoxysilane, N-β-(aminoethyl)-γ-aminopropyl trimethoxysilane, N-β-(aminoethyl)-γ-aminopropylmethyl dimethoxysilane, and γ-ureidopropyl triethoxysilane), epoxy-based silane compounds (e.g., γ-glycidoxypropyl trimethoxysilane, β-(3,4-epoxycyclohexyl)ethyl trimethoxysilane, and γ-glycidoxypropylmethyl diethoxysilane), mercapto-based silane compounds (e.g., γ-mercaptopropyl trimethoxysilane), and phenylamino-based silane compounds (e.g., N-phenyl-γ-aminopropyl trimethoxysilane); titanate-based coupling agents, such as isopropyltriisostearoyl titanate, tetraoctyl-bis(ditridecyl phosphite)titanate, bis(dioctyl pyrophosphate) oxyacetate titanate, isopropyltridodecylbenzenesulfonyl titanate, isopropyl-tris(dioctyl pyrophosphate)titanate, tetraisopropyl-bis(dioctyl phosphite)titanate, tetra(1,1-diallyloxymethyl-1-butyl)bis-(ditridecyl)phosphite titanate, bis (dioctyl pyrophosphate)ethylene titanate, isopropyltrioctanoyl titanate, isopropyldimethacrylisostearoyl titanate, isopropyltristearoyldiacryl titanate, isopropyl-tri(dioctyl phosphate)titanate, isopropyltricumylphenyl titanate, dicumylphenyloxyacetate titanate, and diisostearoyl ethylene titanate; zirconate-based coupling agents, such as ethylenically unsaturated zirconate-containing compounds, neoalkoxy zirconate-containing compounds, neoalkoxytrisneodecanoyl zirconate, neoalkoxytris(dodecyl)benzenesulfonyl zirconate, neoalkoxytris(dioctyl)phosphate zirconate, neoalkoxytris(dioctyl)pyrophosphate zirconate, neoalkoxytris(ethylenediamino)ethyl zirconate, neoalkoxytris(m-amino)phenyl zirconate, tetra(2,2-diallyloxymethyl)butyl-di(ditridecyl)phosphito zirconate, neopentyl(diallyl)oxy-trineodecanoyl zirconate, neopentyl(diallyl)oxy-tri(dodecyl)benzene-sulfonyl zirconate, neopentyl (diallyl)oxy-tri(dioctyl)phosphato zirconate, neopentyl (diallyl)oxy-tri(dioctyl)pyrophosphato zirconate, neopentyl (diallyl)oxy-tri(N-ethylenediamino)ethyl zirconate, neopentyl(diallyl)oxy-tri(m-amino)phenyl zirconate, neopentyl(diallyl)oxy-trimethacryl zirconate, neopentyl(diallyl) oxy-triacryl zirconate, dineopentyl(diallyl)oxy-di-para-aminobenzoyl zirconate, dineopentyl(diallyl)oxy-di(3-mercapto)propionic zirconate, and zirconium (IV) 2,2-bis (2-propenolatomethyl)butanolato-cyclodi[2,2-(bis-2-propenolatomethyl)butanolato]pyrophosphato-O,O; and aluminate-based coupling agents, such as diisobutyl(oleyl) acetoacetyl aluminate and alkylacetoacetate aluminum diisopropylate.

Examples of the dispersant that can be used include high molecular weight-type dispersants, such as polycarboxylic acid-based, naphthalene sulfonic acid-formalin condensation-based, polyethylene glycol-based, polycarboxylic acid partial alkyl ester-based, polyether-based and polyalkylene polyamine-based dispersants; and low molecular weight-type dispersants, such as alkylsulfonic acid-based, quaternary ammonium-based, higher alcohol alkylene oxide-based, polyhydric alcohol ester-based and alkylpolyamine-based dispersants.

Examples of the flame retardant that can be used include hydrated metal-based flame retardants such as aluminum hydroxide and magnesium hydroxide, red phosphorus, ammonium phosphate, ammonium carbonate, zinc borate, zinc stannate, molybdenum compound-based flame retardants, bromine compound-based flame retardants, chlorine compound-based flame retardants, phosphoric acid esters, phosphorus-containing polyols, phosphorus-containing amines, melamine cyanurate, melamine compounds, triazine compounds, guanidine compounds, and silicone polymers.

The fixing agent composition and the resin composition according to the present invention may further contain, for example, an inorganic filler such as barium sulfate, silica or hydrotalcite, an organic filler such as nylon powder or fluorine powder, a radical scavenger, a UV absorber, a peroxide decomposer, a thermal polymerization inhibitor, an adhesion-promoting agent, a corrosion inhibitor, a surface treatment agent, a surfactant, a lubricant, an antistatic agent, a pH-controlling agent, an antioxidant, a dye, a pigment and/or a fluorescent agent, within a range that does not adversely affect the object of the present invention.

[Storage Modulus]

In the present invention, it is required that the storage modulus of the fixing agent 2 be higher than that of the resin 3. The storage modulus of the fixing agent 2 means the storage modulus of a cured film which is obtained by forming a film of a composition consisting of only the components of the fixing agent composition without the fibers 1 and subsequently curing the film with heat or light. In the same manner, the storage modulus of the resin 3 means, in the case where the resin 3 is a curable resin, the storage modulus of a cured film obtained by forming a film of the curable resin and subsequently curing the film with heat or light or, in the case where the resin 3 is a thermoplastic resin, the storage modulus of a coating film obtained by melt-forming a film of the thermoplastic resin and subsequently removing a solvent therefrom. Further, the term "storage modulus" is one index of the sample hardness, which is a value calculated from a strain that is determined by an evaluation called "dynamic viscoelasticity measurement" where the strain is detected by periodically applying a load to a sample under constant temperature change, and a larger value means superior mechanical strength. In the present invention, the storage modulus of the fixing agent 2 may be higher than that of the resin 3 at any one temperature, and the storage modulus of the fixing agent is preferably in a range of 30 to 0.1 GPa, more preferably 20 to 0.5 GPa, while the storage modulus of the resin 3 is preferably in a range of 10 to 0.001 GPa, more preferably 5 to 0.01 GPa. It is preferred that the storage modulus of the fixing agent 2 be higher than that of the resin 3 by at least 0.1 GPa at any one temperature. Particularly, it is preferred that the storage modulus of the fixing agent 2 be higher than that of the resin 3 at any one temperature in a range of 150 to 250° C., and it is more preferred that storage modulus of the fixing agent 2 be higher than that of the resin 3 over the entire temperature range of 150 to 250° C. This enables to use the resin-containing sheet of the present invention even in such a high temperature range of 150 to 250° C. and thus expands the use of the resin-containing sheet, which is preferred.

[Glass Transition Temperature]

In the present invention, it is preferred that the glass transition temperature of the fixing agent 2 be higher than the glass transition temperature or softening temperature of the resin 3. The glass transition temperature of the fixing agent 2 means the glass transition temperature of a cured film which is obtained by forming a film of a composition consisting of only the components of the fixing agent composition without the fibers 1 and subsequently curing the film with heat or light. In the same manner, the glass transition temperature or softening temperature of the resin 3 means, in the case where the resin 3 is a curable resin, the glass transition temperature of a cured film obtained by forming a film of the curable resin and subsequently curing the film with heat or light or, in the case where the resin 3 is a thermoplastic resin, the softening temperature of a coating film obtained by melt-forming a film of the thermoplastic resin and subsequently removing a solvent therefrom. Further, the term "glass transition temperature" refers to a temperature at which the value (loss tangent) calculated from the ratio (E"/E') of the storage modulus (B') and the loss modulus (E"), which ratio is determined by the above-described dynamic viscoelasticity measurement, is the largest, and a larger value of this temperature means superior heat resistance. In the present invention, the upper limit of the glass transition temperature is not particularly restricted. As for the preferred ranges thereof, the glass transition temperature of the fixing agent 2 is 130° C. or higher, more preferably 140° C. or higher, and the glass transition temperature or softening temperature of the resin 3 is 70° C. or higher, more preferably 80° C. or higher, and it is preferred that the glass transition temperature of the fixing agent 2 be higher than the glass transition temperature or softening temperature of the resin 3 by at least 5° C.

[Production of Resin-Containing Sheet]

The resin-containing sheet of the present invention can be obtained by treating the cellulose nanofiber nonwoven fabric 11 with the fixing agent composition to fix together the fibers 1 and then impregnating the thus fixed cellulose nanofiber nonwoven fabric 11 with the resin composition. The resin-containing sheet of the present invention can also be produced as a dry film by, for example, with fibers being arranged on an article to be coated such as a carrier film, sequentially coating thereon the fixing agent composition and the resin composition to impregnate the fibers and subsequently drying the resultant by evaporating the organic solvents contained in the fixing agent composition and the resin composition and, as desired, a cover film may further be laminated on the dry film. In this case, as long as the resin composition does not interfere with the fiber-fixing performance of the fixing agent composition, the process of coating the resin composition may be performed at any point before or after the drying of the fixing agent.

In this case, the fixing agent composition and the resin composition according to the present invention can be coated after, as required, blending, dispersing and/or diluting the respective components to adjust the viscosity to be appropriate for a coating method. As described above, the fixing agent composition may be any composition as long as it is capable of permeating into the cellulose nanofiber nonwoven fabric 11 and fixing together the fibers 1, and the resin composition may also be any composition as long as it is capable of tightly adhering at least one side, particularly both sides, of the cellulose nanofiber nonwoven fabric 11 with a metal foil or the like.

The article to be coated is preferably a carrier film for dry films; however, the compositions may also be directly coated on the surface of a metal foil or the surface of a wiring board on which a circuit has been formed. Specific examples of the coating method include various coating methods, such as a dropping method using a pipet or the like, a dip coating method, a bar coater method, a spin coating method, a curtain coating method, a spray coating method, a roll coating method, a slit coating method, a blade coating method, a lip coating method, a comma coating method and a film coating method; and various printing methods, such as screen printing, spray printing, ink-jet printing, relief printing, intaglio printing and planographic printing.

Further, the carrier film and the cover film may each be any film as long as it is known as a material used for a dry film, and examples thereof include a polyethylene film and a polypropylene film. The carrier film and the cover film may be the same film material or different film materials; however, it is preferred that the cover film be less adhesive than the carrier film with the resin 3.

A structure can be obtained by tightly adhering the resin-containing sheet of the present invention to a substrate. Examples of the substrate include a metal foil substrate and a circuit board (a wiring board on which a circuit has been formed). A resin insulating layer can be formed by thermally adhering the resin-containing sheet of the present invention onto the substrate surface and, by repeating this process, a metal foil layer and a resin insulating layer can each be laminated in a plurality of layers. The resin-containing sheet may be laminated with one another when produced on a carrier film, or at the time of being adhered with a metal foil or the like.

In the production of a structure using the resin-containing sheet of the present invention, in cases where the fixing agent composition and the resin composition are a combination of a thermosetting resin and a photocurable resin, a structure can be produced by a method in which only heat-curing is performed, a method in which only irradiation with an active energy ray is performed, a method in which irradiation with an active energy ray is followed by heat-curing, or a method in which heat-curing is followed by irradiation with an active energy ray. Further, when a dry film is used, a structure can be produced by, after peeling off a cover film if any, thermally adhering the resin-containing sheet onto the substrate surface, subsequently peeling off the carrier film, and then curing the sheet by the above-described curing method. In cases where the fixing agent composition and the resin composition are both thermosetting resins, the heat-curing process for the fixation of the fibers and that for the impregnation of the resin may be performed simultaneously. Further, with regard to the temperature at which the heating is performed, the lower and upper limits thereof are not particularly restricted as long as the heating temperature is in such a range where the fibers contained in the intended base material and the fixing agent are not decomposed by intense heat. Also for the exposure dose in the irradiation with an active energy ray, the lower and upper limits thereof are not particularly restricted as long as an excessively low exposure dose does not cause the formation of an uncured portion.

Further, for the production of the re-sin-containing sheet of the present invention, when the resin composition is a thermoplastic resin, a method of heating or thermally bonding the pellet-form or sheet-form thermoplastic resin can be employed as well. In order to impregnate the thermoplastic resin into the cellulose nanofiber nonwoven fabric fixed with the fixing agent, although it is not required to apply thereto a pressure using an apparatus, application of a pressure allows the thermoplastic resin to more easily infiltrate into the cellulose nanofiber nonwoven fabric. When a pressure is applied, the upper limit of the pressure is not particularly restricted as long as the pressure does not deteriorate the intended shape of the resulting resin-containing sheet. A structure can be formed by thermally adhering this resin-containing sheet onto the substrate surface. Moreover, for the formation of a structure using a dry film, the structure can produced in the same manner as described above.

Examples of apparatuses that can be used for the above-described drying, heat-curing or heat-pressing include a hot air circulation-type drying oven, an IR oven, a hot plate, a convection oven, a heat-press roll, and a press machine. Further, examples of a light source used for the irradiation with an active energy ray include a low-pressure mercury lamp, a medium-pressure mercury lamp, a high-pressure mercury lamp, an ultrahigh-pressure mercury lamp, a xenon lamp, and a metal halide lamp. In addition, a laser beam or the like can also be utilized as the active energy ray.

The thickness of the cellulose nanofiber nonwoven fabric which is a constituent member of the resin-containing sheet of the present invention, the thickness of an article obtained by fixing together the fibers contained in the cellulose nanofiber nonwoven fabric with a fixing agent (hereinafter, such an article is referred to as "intermediate") and the thickness of the dry film are not particularly restricted and are each selected as appropriate in accordance with the purpose thereof; however, particularly for the intermediate, since the intermediate may be any article in which the fibers are fixed with one another by the fixing agent, it is preferred that the thickness thereof be equal to the thickness of the cellulose nanofiber nonwoven fabric, or such a thickness that does not exceed twice the thickness of the cellulose nanofiber nonwoven fabric. Specifically, the thickness of the intermediate is preferably in a range of 1 to 1.5 times of the thickness of the cellulose nanofiber nonwoven fabric. When the thickness of the intermediate is greater than twice the thickness of the cellulose nanofiber nonwoven fabric, the physical properties of the fixing agent itself are affected, which is not preferred.

A structure obtained by forming the resin-containing sheet of the present invention on the surface of a substrate and subsequently curing or molding the resultant can be used as a core material of a wiring board, and the structure can also be subjected to an etching treatment or the like to be used as an interlayer insulating material of a wiring board. Further, such a structure that is obtained by forming the resin-containing sheet on the surface of a wiring board on which a circuit has been formed and subsequently patterning and curing or molding the thus formed sheet such that it covers only the circuit wiring can be used as, for example, a solder resist which is the outermost layer of a wiring board.

The resin-containing sheet of the present invention having the above-described constitution can be applied to, for example, wiring boards for electronic devices, suitably as an interlayer insulating material, solder resist, core material or the like of wiring boards, whereby the expected effects of the present invention can be attained. Furthermore, a multilayer board can also be produced by, for example, fixing together the fibers with the fixing agent composition, impregnating the fibers with a resin and drying the resultant to form a resin insulating layer in a semi-cured state (B stage), and then press-laminating the thus formed resin insulating layer with a metal foil.

EXAMPLES

The present invention will now be described in more detail by way of examples and comparative examples thereof; however, the present invention is not restricted thereto. It is noted here that the amounts shown in Tables below are all based on parts by mass.

[Synthesis of Polyamic Acid Varnish 1]

To a stirrer-equipped three-necked flask which had been purged with nitrogen, dehydrated N-methyl-2-pyrrolidone (NMP) solvent (manufactured by Wako Pure Chemical Industries, Ltd.) was added, and 4,4'-diaminodiphenyl ether (ODA) (manufactured by Wako Pure Chemical Industries, Ltd.) and 1,2,4,5-benzenetetracarboxylic dianhydride (PMDA) (manufactured by Wako Pure Chemical Industries, Ltd.) were added thereto at a molar ratio of 1:1. The resultant was stirred at room temperature for at least 16 hours to obtain a polyamic acid varnish 1 having a resin solid content of 7.5% by mass.

[Synthesis of Polyamic Acid Varnish 2]

To a stirrer-equipped three-necked flask which had been purged with nitrogen, dehydrated N-methyl-2-pyrrolidone (NMP) solvent (manufactured by Wako Pure Chemical Industries, Ltd.) was added, and p-phenylenediamine (PDA) (manufactured by Wako Pure Chemical Industries, Ltd.) and 3,3',4,4'-biphenyltetracarboxylic anhydride (BPDA) (manufactured by Wako Pure Chemical Industries, Ltd.) were added thereto at a molar ratio of 1:1. The resultant was stirred at room temperature for at least 16 hours to obtain a polyamic acid varnish 2 having a resin solid content of 7.5% by mass.

[Preparation of Fixing Agent Composition or Resin Composition]

Table 1 below shows the added contents of the respective compositions 1 to 4 used as a fixing agent composition or a resin composition. The compositions 1 to 4 were each prepared in accordance with Table 1 below. The multiple-component system of the composition 1 was prepared by blending the components and subsequently stirring the resultant using a planetary centrifugal mixer.

[Preparation of Test Pieces for Evaluation of Storage Modulus and the Like of Fixing Agents or Resins]

The compositions 1 to 4 were each coated on an 18 μm-thick copper foil using an applicator to obtain coating films.

As for the composition 1, the thus obtained coating film was dried in a hot air circulation-type drying oven under atmospheric conditions at 80° C. for 30 minutes and subsequently heated under atmospheric conditions at 150° C. for 60 minutes to obtain an epoxy resin cured article. After the removal of the copper foil, the cured article had a thickness of 50 . Using this cured article, a test piece for the evaluation of storage modulus and the like, which had a width of 5 mm and a length of 50 mm, was prepared.

As for the composition 2, the composition 2 was coated and then dried in a hot air circulation-type drying oven under atmospheric conditions at 80° C. for 30 minutes, followed by heating under nitrogen condition (100 ml/min.) at 230° C. for 60 minutes to obtain an imidization product. After the removal of the copper foil the imidization product had a thickness of 50 μm. Thereafter, a test piece for evaluation was prepared in the same manner as described above.

As for the composition 3, a test piece for evaluation was prepared in the same manner as in the case of the composition 2, except that the heating operation was performed under nitrogen condition at 300° C. for 60 minutes.

As for the composition 4, after an appropriate amount of a high-density polyethylene pellet (specific gravity=095) was fed to a press machine and heat-pressed at 140° C. and 3 MPa for 3 minutes, the resultant was cooled to room temperature to obtain a molded article. When the molded article was subsequently diced into pieces, each piece had a thickness of 50 μm. Thereafter, a test piece for evaluation was prepared in the same manner as described above.

[Preparation of Test Pieces for Evaluation of Storage Modulus of Resin-Containing Sheets or Sheets]

Table 2 below shows the constitutions of the resin-containing sheets and sheets of Examples and Comparative Examples.

[Production of Cellulose Nanofiber Nonwoven Fabric]

Tencel cut yarns (3 mm in length), which are regenerated cellulose fibers obtained from Sojitz Corporation, were put into a washing net, and a surfactant was added thereto. Then, by washing the fibers with water multiple times using a washing machine, the oil agent on the fiber surface was removed. The thus purified Tencel fibers (cut yarns) were dispersed in water (400 L) such that the resulting dispersion had a solid content of 1.5% by mass and, using SDR14 Lab Refiner manufactured by AIKAWA Iron Works Co., Ltd. (pressure disc-type) as a disc refiner apparatus at a disc clearance of 1 mm, 400 L of the aqueous dispersion was subjected to a beating treatment for 20 minutes. Thereafter, the beating treatment was continued under a condition where the disc clearance was reduced to nearly zero. Samples were collected over time and, when the CSF value defined in JIS P8121 was evaluated for the thus obtained slurry samples, it was confirmed that the CSF value exhibited a tendency that it once decreased with time to nearly zero and then increased with the continued beating treatment. By continuously performing the beating treatment under the above-described conditions for about 14 hours after the disc clearance was reduced to nearly zero, a beat aqueous dispersion having a CSF value of 15 ml↑ (solid concentration: 1.5% by mass) was obtained. The thus obtained beat aqueous dispersion was directly subjected to a single round and five rounds of refining treatment using a high-pressure homogenizer (NS015H, manufactured by GEA Niro Soavi S.p.A. (Italy)) at an operating pressure of 100 MPa, whereby a fine cellulose fiber aqueous dispersions M1 and M2 (solid concentration: 1.5% by mass in both dispersions) were obtained, respectively.

Subsequently, after the aqueous dispersion M2 was diluted to a solid concentration of 0.1.% by mass and dispersed using a blender, the thus prepared papermaking slurry was fed to a batch-type papermaking machine (an automated square sheet machine manufactured by Kumagai Riki Kogyo Co., Ltd.; 25 cm×25 cm, 80-mesh), on which a PET/nylon-blend plain weave fabric (NT20 manufactured by Shikishima Canvas Co., Ltd.; water permeability at 25° C. under atmospheric pressure=0.03 ml/cm$^2$·s, capable of separating 99% or more fine cellulose fibers by filtration at 25° C. under atmospheric pressure) was set, aiming at obtaining a fine cellulose sheet having a basis weight of 10 g/m$^2$. Thereafter, papermaking (dehydration) was carried out at a vacuum level of 4 KPa with respect to the atmospheric pressure.

The resulting wet paper, which was formed on the filter cloth and composed of a concentrated composition in a wet state, was detached from the wire and pressed for 1 minute at a pressure of 1 kg/cm$^2$. Then, the wet paper was dried for about 120 seconds on a drum dryer whose surface temperature was set at 130° C., in a two-layer state consisting of the wet paper and the filter cloth with the wet paper surface being in contact with the drum surface, and the filter cloth was subsequently detached from the resulting cellulose sheet-form structure composed of the thus dried two layers, whereby a sheet (25 cm×25 cm) composed of white and uniform fine cellulose fibers was obtained.

Further, by subjecting the thus obtained fine cellulose sheet to a hot-press treatment at 150° C. and 1.55 t/20 cm using a calendaring machine (manufactured by YURI ROLL Co., Ltd.), a white cellulose nanofiber nonwoven fabric, having a film thickness of 17 μm, a specific surface area-equivalent fiber diameter of 0.442 μm, an air permeation resistance of 11 s/100 ml, a porosity of 62% and a chloride ion concentration of 19 ppm was obtained.

Preparation of Intermediate of Example 1

For Example 1 shown in Table 2 below, the thus obtained cellulose nanofiber nonwoven fabric was impregnated with the composition 1 (viscosity: 0:0005 Pa·s) and then dried in a hot air circulation-type drying oven under atmospheric conditions at 80° C. for 30 minutes, after which the resultant was heat-cured at 150° C. for 60 minutes to prepare an intermediate composed of the cellulose nanofiber nonwoven fabric and a fixing agent (cured epoxy resin composition).

Preparation of Intermediate of Example 2

For Example 2 shown in Table 2 below, the same cellulose nanofiber nonwoven fabric as the one used in Example 1 was impregnated with the composition 2 (viscosity: 0.001 Pa·s) and then dried in a hot air circulation-type drying oven under atmospheric conditions at 80°C. for 30 minutes, after which the resultant was imidized by heating at 250° C. for 60 minutes to prepare an intermediate composed of the cellulose nanofiber nonwoven fabric and a fixing agent (polyimide).

Preparation of Intermediate of Example 3

For Example 3 shown in Table 2 below, the same cellulose nanofiber nonwoven fabric as the one used in Example 1 was impregnated with the composition 3 (viscosity: 0.001 Pa·s) and then dried in a hot air circulation-type drying oven under atmospheric conditions at 1.0 80° C. for 30 minutes, after which the resultant was imidized by heating at 300° C. for 60 minutes to prepare an intermediate composed of the cellulose nanofiber nonwoven fabric and a fixing agent (polyimide).

Preparation of Intermediate of Comparative Example 4

In the same manner as in Example 1, using the composition 1, an intermediate is composed of the cellulose nanofiber nonwoven fabric and a fixing agent (cured epoxy resin composition) was prepared.

The intermediates of Examples 1 to 3 and Comparative Example 4 each had a thickness of 33 to 35 μm and, therefore, the increase in thickness from that of the cellulose nanofiber nonwoven fabric was mere 3 to 5 μm.

Preparation of Resin-Containing Sheets and Sheets of Examples and Comparative Examples For Example 1, after feeding the composition 4 to a press machine and inciting it at 140° C., the above-obtained intermediate was impregnated with the thus molten composition 4 and subsequently heat-pressed for 3 minutes at 140° C. and 3 MPa, after which the resultant was cooled to room temperature to prepare a resin-containing sheet in which the cellulose nanofiber nonwoven fabric fixed with the fixing agent (epoxy resin composition) was impregnated with the resin (high-density polyethylene resin).

For Examples 2 and 3, the respective intermediates obtained above were each coated and impregnated with an appropriate amount of the composition 1 such that the composition 1 was spread to all of the fibers, and subsequently heat-cured under the same conditions as in the above-described preparation of test pieces for evaluation of fixing agents or resins, whereby resin-containing sheets in which the cellulose nanofiber nonwoven fabric fixed with the fixing agent (polyimide) was impregnated with the resin (cured epoxy resin) were prepared.

The resin-containing sheets of Examples 1 to 3 each had a thickness greater than that 1.0 of each intermediate by 10 to 20 μm. Thereafter, for each of these resin-containing sheets, a test piece for evaluation was prepared under the same conditions as described above.

For Comparative Example 1, the cellulose nanofiber nonwoven fabric was coated and impregnated with an appropriate amount of the composition 1 such that the composition 1 was spread to all of the fibers, and subsequently heat-cured under the same conditions as in the above-described preparation of test pieces for evaluation of fixing agents or resins, whereby a sheet in which the cellulose nanofiber nonwoven fabric containing no fixing agent was impregnated with the resin (cured epoxy resin) was prepared.

For Comparative Example 2, after coating and impregnating the cellulose nanofiber nonwoven fabric with the composition 2 in the same manner as in Comparative Example 1, the cellulose nanofiber nonwoven fabric was dried in a hot air circulation-type drying oven under atmospheric conditions at 80° C. for 30 minutes, after which the resultant was imidized by heating at 250° C. for 60 minutes to prepare a sheet in which the cellulose nanofiber nonwoven fabric containing no fixing agent was impregnated with the resin (polyimide).

For Comparative Example 3, after feeding the composition 4 to a press machine and melting it at 140° C., the cellulose nanofiber nonwoven fabric was impregnated with the thus molten composition 4 and subsequently heat-pressed for 3 minutes at 140° C. and 3 MPa, after which the resultant was cooled to room temperature to prepare a sheet in which the cellulose nanofiber nonwoven fabric containing, no fixing agent was impregnated with the resin (high-density polyethylene resin).

For Comparative Example 4, a resin-containing sheet was prepared in the same manner as in Comparative Example 2, except that the fixing agent-containing intermediate composed of the composition 1 was used in place of the cellulose nanofiber nonwoven fabric used in Comparative Example 2.

Thereafter, for each of the above-obtained sheets, a test piece for evaluation was prepared in the same manner as described above.

As shown in Table 2 below, the resin concentrations were about the same in all of Examples 1 to 3 and Comparative Examples 1 to 4. It is noted here that the resin concentrations were determined from the followings:

Amount of fixing agent={1−(volume of cellulose nanofiber nonwoven fabric/volume of intermediate)}×100 [% by volume], and Amount of resin={1−(volume of intermediate/volume of resin-containing sheet or sheet)}×100 [% by, volume] (the volume was calculated based on the mass and the specific gravity).

[Measurement of Storage Modulus, etc.]

For the above-prepared test pieces for evaluation of the storage modulus and the like of the fixing agents or resins, using a DMA viscoelasticity analyzer (DMA7100, manufactured by Hitachi High-Tech Science Corporation) in a tensile mode, the viscoelasticity was measured under atmospheric conditions at a measuring frequency of 1 Hz, a minimum tension and a minimum compression force of 200 mN, a strain amplitude of 10 μm and a heating rate of 5° C./min, whereby not only the storage modulus was determined at 50° C., 150° C. and 250° C. but also the grass transition temperature or softening temperature was determined. The results thereof are shown in Table 1 below.

TABLE 1

|  |  | Composition | | | |
| --- | --- | --- | --- | --- | --- |
|  |  | 1 | 2 | 3 | 4 |
| Epoxy resin 828*[1] |  | 100 |  |  |  |
| Polyamic acid varnish 1 |  |  | 100 |  |  |
| Polyamic acid varnish 2 |  |  |  | 100 |  |
| 2E4MZ*[2] |  | 5 |  |  |  |
| Methyl ethyl ketone*[3] |  | 1,900 |  |  |  |
| High-density polyethylene*[4] |  |  |  |  | 100 |
| Glass transition temperature or softening temperature (° C.) |  | 160 | >250 | >250 | 130 |
| Storage modulus, E [GPa] | 50° C. | 2.0 | 3.2 | 2.5 | 1.4 |
|  | 150° C. | 0.77 | 2.5 | 2.0 | NA |
|  | 250° C. | 0.07 | 2.0 | 1.6 | NA |

*[1] jER828, manufactured by Mitsubishi Chemical Corporation
*[2] 2-ethyl-4-methylimidazole, manufactured by Shikoku Chemicals Corporation
*[3] manufactured by Wako Pure Chemical Industries, Ltd.
*[4] specific gravity = 0.95

[Evaluation of Storage Modulus of Resin-Containing Sheet or Sheet]

For the test pieces for evaluation of the resin-containing sheets or sheets, the viscoelasticity was measured and the storage modulus was determined at 50° C., 150° C. and 250° C. in the same manner as described above, except that each test piece was mounted such that the bias (oblique) direction of the fibers of the cellulose nanofiber nonwoven fabric or aramid nonwoven fabric in each sheet was aligned with the tensile direction of the analyzer, and that the minimum tension and the compression force were changed to 50 mN. The reason why the measurement was performed in the bias (oblique) direction was to eliminate the effect of the elastic modulus of the cellulose nanofiber nonwoven fabric itself as much as possible and to investigate the effect of the fixation on improvement of the elastic modulus. For the resin-containing sheets of Examples, comparing to the sheets of Comparative Examples in which no fixing agent was incorporated, an evaluation of "∘" was given when the value of the storage modulus E [GPa] was larger, while an evaluation of "x" was given when the value of the storage modulus E [GPa] was smaller.

Specifically, the resin-containing sheet of Example 1 had a larger value of the storage modulus E [GPa] at all of the temperatures of 50° C., 150° C. and 250° C. than the sheet of Comparative Example 3 in which no fixing agent was used; therefore, an evaluation of "∘" was given.

For the resin-containing sheets of Examples 2 and 3 as well, an evaluation of "∘" was given since the value of the storage modulus E [GPa] was larger than that of the sheet of Comparative Example 1 in which no fixing agent was used.

Meanwhile, the resin-containing sheet of Comparative Example 4 had a smaller value of the storage modulus E [GPa] at all of the temperatures of 50° C., 150° C. and 250° C. than the sheet of Comparative Example 2 in which no fixing agent was used; therefore, an evaluation of "x" was given. The evaluation results are shown in Table 2 below.

[Preparation of Test Pieces for Evaluation of Flexural Resistance]

Intermediates were each prepared by coating and impregnating the respective fixing agent compositions in the same manner as described above, except that the cellulose nanofiber nonwoven fabric was arranged on a carrier film. Then, after forming or coating each resin composition on the surface of the dried fixing agent and drying the resultant, a cover film was laminated thereon to obtain a dry film. On both sides of this dry film, a 18 μm-thick copper foil with untreated surface was laminated (the carrier film and the cover film were removed before adhesion) and, the resultant was molded using a vacuum press machine at a pressure of 1 MPa under the following heating conditions: at 150° C. for 10 minutes for Example 1; at 250° C. for 60 minutes for Example 2 and Comparative Example 4; and at 300° C. for 60 minutes for Example 3, whereby each test piece for evaluation of the flexural resistance in which the resin layer and the copper foil were tightly adhered was prepared.

Further, for Comparative Examples 1 to 3, a dry film was prepared in the same manner as described above, except that no fixing agent composition was coated and impregnated, and each test piece for evaluation of the flexural resistance was prepared under the same temperature conditions as in the preparation of the sheets of Comparative Examples 1 to 3.

[Evaluation of Flexural Resistance]

The thus obtained test pieces for evaluation of the flexural resistance were subjected to a bending test where each test piece was bent in the direction of bringing the resin layer inward at a bending radius of 0.8 mm, a bending rate of 175 times/minute and a bending angle of 135° with a load of 200 g. The flexural resistance was evaluated as "o", "Δ" or "x" when the test piece was broken after being bent 100 times or more, 70 to 99 times, or 69 times or less, respectively. The results thereof are shown in Table 2. The flexural resistance is said to be excellent when the evaluation is "o".

As shown in Table 2, it is seen that the resin-containing sheets of Examples, in which the cellulose nanofiber nonwoven fabric was fixed using a fixing agent having a storage modulus higher than those of the respective resins and further impregnated with respective resins, exhibited superior flexural resistance and had a higher storage modulus as compared to the sheets of Comparative Examples in which only the respective resins were impregnated.

For example, as clearly seen from the comparison between Example 1 and Comparative Example 3, as compared to the sheet of Comparative Example 3 in which the fibers of the cellulose nanofiber nonwoven fabric were not fixed together using a fixing composition, the resin-containing sheets of Examples, in which the fibers of the cellulose nanofiber nonwoven fabric were fixed together by a fixing composition and the cellulose nanofiber nonwoven fabric was further impregnated with a resin composition, were all found to have higher mechanical strength because they exhibited a higher elastic modulus at all of the tested temperatures.

Particularly, it is seen that the resin-containing sheets of Examples 2 and 3 also had excellent mechanical strength at a high temperature, with their storage moduli at 250° C. being higher than 1 GPa. On the other hand, in Comparative Example 4 where the storage modulus of the fixing agent was lower than that of the resin, the resin-containing sheet had a low storage modulus.

From the above, it was confirmed that excellent mechanical strength, elastic modulus and flexural resistance can be realized by using a resin-containing sheet which comprises: a fixing agent that fixes together fibers in a cellulose nanofiber nonwoven fabric; and a resin that is in contact with the fixed fibers, wherein the storage modulus of the fixing agent is higher than that of the resin. The resin-containing sheet of the present invention can be applied to, for example, wiring boards for electronic devices, suitably as an interlayer insulating material, solder resist, core material or the like of wiring boards.

TABLE 2

|  |  | Example | | | Comparative Example | | | |
| --- | --- | --- | --- | --- | --- | --- | --- | --- |
|  |  | 1 | 2 | 3 | 1 | 2 | 3 | 4 |
| Resin-containing sheet or sheet |  | Resin-containing sheet | | | Sheet | | | Resin-containing sheet |
| Cellulose nanofiber nonwoven fabric |  | Cellulose nanofiber nonwoven fabric | | | | | | |
| Type of fixing agent composition |  | 1 | 2 | 3 | — | | | 1 |
| (resin concentration in resin-containing sheet or sheet [% by volume]) |  | (5) | (4) | (4) | | | | (5) |
| Type of resin composition |  | 4 | 1 | 1 | 1 | 2 | 4 | 2 |
| (resin concentration in resin-containing sheet or sheet [% by volume]) |  | (20) | (22) | (21) | (25) | (25) | (24) | (22) |
| Comparison of storage modulus $E_B$: storage modulus of fixing agent $E_r$: storage modulus of resin |  | $E_B > E_r$ | $E_B > E_r$ | $E_B > E_r$ | — | — | — | $E_B < E_r$ |
| Storage modulus of resin-containing sheet or sheet, E [GPa] | 50° C. | 2.1 | 4.6 | 3.7 | 3.0 | 4.5 | 1.5 | 4.1 |
|  | 150° C. | 0.4 | 4.1 | 3.0 | 2.2 | 3.8 | 0.2 | 2.4 |
|  | 250° C. | 0.1 | 3.0 | 2.0 | 0.7 | 2.9 | broken | 1.0 |
| Evaluation of mechanical strength (evaluation of storage modulus, E [GPa]) |  | o | o | o | — | — | — | x |
| Evaluation of flexural resistance |  | o | o | o | x | x | o | x |

As shown in Table 2, the fixing agents of Examples 1 to 3 all had a storage modulus higher than those of the respective resins, whereas, in Comparative Example 4, the storage modulus of the fixing agent was lower than that of the resin. Further, in Comparative Examples 1 to 3, the respective resins were used alone without any fixing agent,

DESCRIPTION OF SYMBOLS

1: Fiber
2: Fixing agent
3: Resin
11: Cellulose nanofiber nonwoven fabric
S: Space

The invention claimed is:

1. A resin-containing sheet comprising:

a cellulose nanofiber nonwoven fabric which is constituted by a single layer or not more than three plural layers comprising at least one cellulose fine fiber layer that contains regenerated cellulose fine fibers in an amount of not less than 70% by mass, said cellulose nanofiber nonwoven fabric satisfying all of the following requirements (1) to (3):

(1) fibers constituting said cellulose fine fiber layer has a specific surface area fiber diameter of 0.20 µm to 1.0 µm, (2) the air permeation resistance is 1 s/100 ml to 40 s/100 ml, and (3) the film thickness is 8 µm to 22 µm;

a fixing agent which fixes together said fibers in said cellulose nanofiber nonwoven fabric; and a resin which is in contact with said cellulose nanofiber nonwoven fabric and said fixing agent, wherein the storage modulus of said fixing agent is higher than that of said resin.

2. The resin-containing sheet according to claim 1, wherein the glass transition temperature of said fixing agent is higher than the glass transition temperature or the softening temperature of said resin.

3. The resin-containing sheet according to claim 1, which is obtained by fixing together said fibers of said cellulose nanofiber nonwoven fabric using a fixing agent composition and subsequently impregnating the thus fixed cellulose nanofiber nonwoven fabric with a resin composition.

4. The resin-containing sheet according to claim 3, wherein said fixing agent composition has a viscosity of 1 Pa·s or less.

5. A structure obtained by tightly adhering the resin-containing sheet according to claim 1 to a substrate.

6. A wiring board comprising the structure according to claim 5.

* * * * *